US010741703B2

(12) United States Patent
Caswell et al.

(10) Patent No.: US 10,741,703 B2
(45) Date of Patent: Aug. 11, 2020

(54) SHINGLED SOLAR CELLS OVERLAPPING ALONG NON-LINEAR EDGES

(71) Applicant: SunPower Corporation, San Jose, CA (US)

(72) Inventors: Nathaniel Alexis Caswell, Sunnyvale, CA (US); Maritza Ruiz, Campbell, CA (US); Tamir Lance, Los Gatos, CA (US); Nathan Beckett, Oakland, CA (US); David DeGraaff, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 77 days.

(21) Appl. No.: 15/395,727

(22) Filed: Dec. 30, 2016

(65) Prior Publication Data

US 2018/0033902 A1    Feb. 1, 2018

Related U.S. Application Data

(60) Provisional application No. 62/368,916, filed on Jul. 29, 2016.

(51) Int. Cl.
*H01L 31/0224* (2006.01)
*H01L 31/05* (2014.01)
*H01L 31/048* (2014.01)
*H01L 31/0352* (2006.01)

(52) U.S. Cl.
CPC ............... *H01L 31/022433* (2013.01); *H01L 31/035281* (2013.01); *H01L 31/0488* (2013.01); *H01L 31/0508* (2013.01); *Y02E 10/50* (2013.01)

(58) Field of Classification Search
CPC ............. H01L 31/0463; H01L 31/0465; H01L 31/0508; H01L 31/035281; H01L 31/0468; H01L 31/0684; H01L 31/022433
See application file for complete search history.

(56) References Cited

U.S. PATENT DOCUMENTS

| 3,369,939 A * | 2/1968 | Myer ...................... H01L 31/00 136/244 |
| 8,426,726 B2 | 4/2013 | Taira et al. |
| 8,987,038 B2 | 3/2015 | Dimitrov et al. |

(Continued)

FOREIGN PATENT DOCUMENTS

| JP | 08051226 A * | 2/1996 | ..... H01L 31/035272 |
| JP | 2007115649 A * | 5/2007 | |
| KR | 10-2009-0084741 A | 8/2009 | |

OTHER PUBLICATIONS

Machine translation of JP08-051226A.*

(Continued)

*Primary Examiner* — Eric R Smith
(74) *Attorney, Agent, or Firm* — Oblon, McClelland, Maier & Neustadt, L.L.P.

(57) ABSTRACT

Solar devices and methods for producing solar devices are disclosed. In some examples, a solar device includes solar cells arranged in a shingled manner such that adjacent long edges of adjacent ones of the solar cells overlap. The adjacent long edges have a non-linear shape that has protruding portions. The solar device includes contact pads arranged in the protruding portions of the adjacent long edges such that the contact pads of the adjacent ones of the solar cells are electrically connected.

16 Claims, 25 Drawing Sheets

(56) References Cited

U.S. PATENT DOCUMENTS

| | | | |
|---|---|---|---|
| 9,356,184 B2 | 5/2016 | Morad et al. | |
| 9,397,252 B2 | 7/2016 | Morad et al. | |
| 9,401,438 B2 | 7/2016 | Huang | |
| 9,401,451 B2 | 7/2016 | Morad et al. | |
| 9,484,484 B2 | 11/2016 | Morad et al. | |
| 2003/0127128 A1* | 7/2003 | Fabick | H01L 31/0392 |
| | | | 136/256 |
| 2009/0194144 A1 | 8/2009 | Taira et al. | |
| 2010/0275983 A1* | 11/2010 | Kaes | H01L 31/022425 |
| | | | 136/255 |
| 2010/0307567 A1* | 12/2010 | Huang | H01L 31/022433 |
| | | | 136/251 |
| 2011/0247672 A1* | 10/2011 | Van Riesen | H01L 31/035281 |
| | | | 136/244 |
| 2012/0090673 A1 | 4/2012 | Dimitrov et al. | |
| 2012/0234375 A1* | 9/2012 | Nakamura | H01L 31/035272 |
| | | | 136/249 |
| 2014/0124013 A1 | 5/2014 | Morad et al. | |
| 2014/0124014 A1 | 5/2014 | Morad et al. | |
| 2014/0144479 A1* | 5/2014 | Kim | H01L 31/0463 |
| | | | 136/244 |
| 2015/0129011 A1 | 5/2015 | Huang | |
| 2015/0129019 A1 | 5/2015 | Huang | |
| 2015/0162482 A1 | 6/2015 | Dimitrov et al. | |
| 2015/0349145 A1 | 12/2015 | Morad et al. | |
| 2015/0349153 A1 | 12/2015 | Morad et al. | |
| 2015/0349161 A1 | 12/2015 | Morad et al. | |
| 2015/0349162 A1 | 12/2015 | Morad et al. | |
| 2015/0349167 A1 | 12/2015 | Morad et al. | |
| 2015/0349168 A1 | 12/2015 | Morad et al. | |
| 2015/0349169 A1 | 12/2015 | Morad et al. | |
| 2015/0349170 A1 | 12/2015 | Morad et al. | |
| 2015/0349171 A1 | 12/2015 | Morad et al. | |
| 2015/0349172 A1 | 12/2015 | Morad et al. | |
| 2015/0349173 A1 | 12/2015 | Morad et al. | |
| 2015/0349174 A1 | 12/2015 | Morad et al. | |
| 2015/0349175 A1 | 12/2015 | Morad et al. | |
| 2015/0349176 A1 | 12/2015 | Morad et al. | |
| 2015/0349190 A1 | 12/2015 | Morad et al. | |
| 2015/0349193 A1 | 12/2015 | Morad et al. | |
| 2015/0349701 A1 | 12/2015 | Morad et al. | |
| 2015/0349702 A1 | 12/2015 | Morad et al. | |
| 2015/0349703 A1 | 12/2015 | Morad et al. | |
| 2017/0179320 A1* | 6/2017 | Erben | H01L 31/0465 |
| 2017/0236962 A1* | 8/2017 | Beleznay | H01L 31/02366 |
| | | | 136/246 |

OTHER PUBLICATIONS

Machine translation of JP2007-115649A.*
International Search Report and Written Opinion dated Nov. 8, 2017 in Corresponding PCT/US2017/044588 filed Jul. 31, 2017.

* cited by examiner

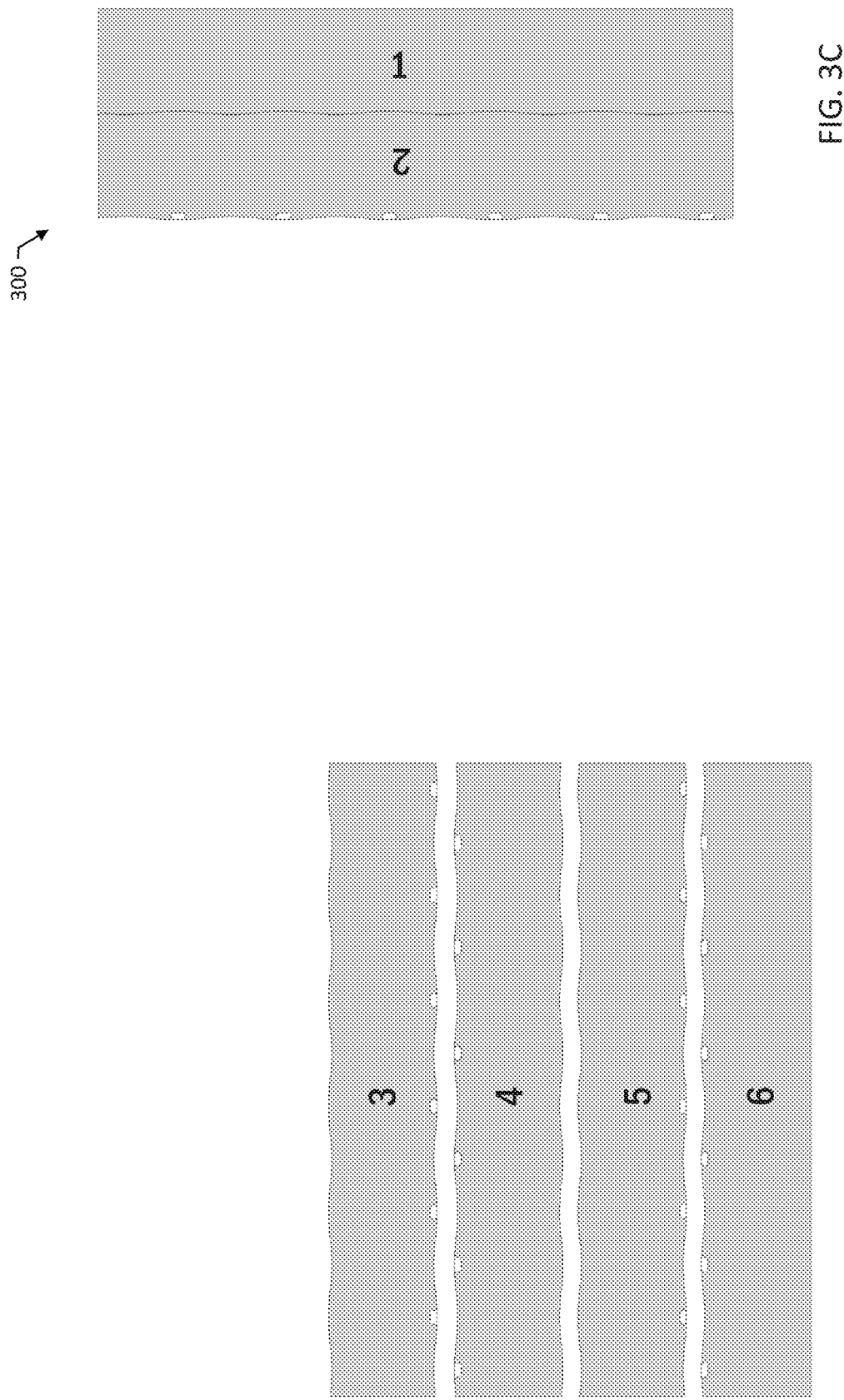

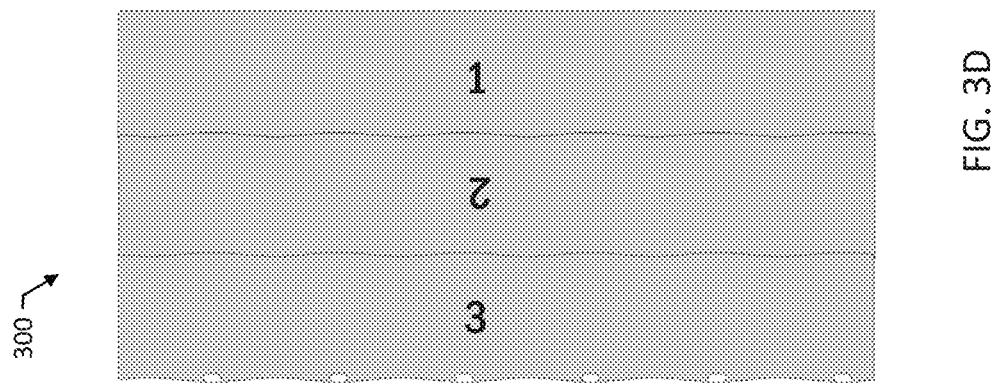
FIG. 3D
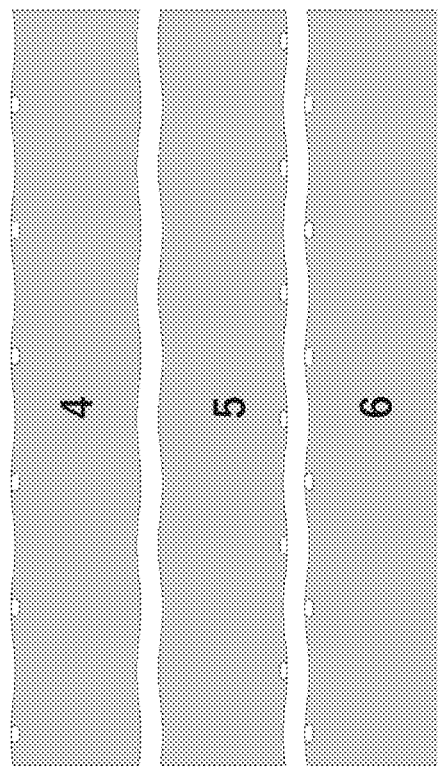

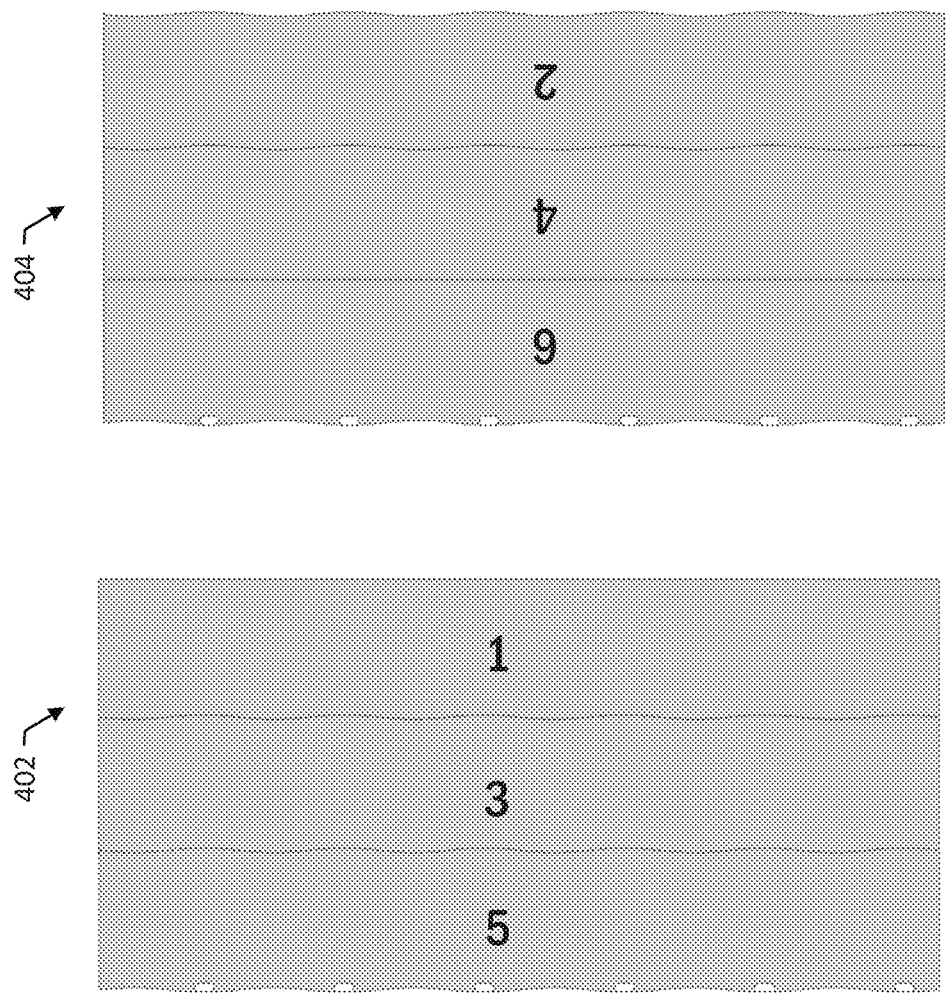

SHINGLED SOLAR CELLS OVERLAPPING ALONG NON-LINEAR EDGES

PRIORITY CLAIM

This application claims the benefit of U.S. Provisional Application Ser. No. 62/368,916, filed Jul. 29, 2016, the disclosure of which is incorporated by reference in its entirety.

BACKGROUND

The subject matter described in this specification relates generally to photovoltaic solar cells and in particular to shingled solar cells.

Photovoltaic (PV) cells, commonly known as solar cells, are well-known devices for converting solar radiation into electrical energy. PV cells can be assembled into PV modules (also referred to as solar modules), which may be used to convert sunlight into electricity. A solar energy system typically includes multiple PV modules, one or more inverters, and interconnection wiring. The PV module can include a frame, which can be mounted on top of a building, and the other components can be located on the outside or inside of the building to interface with an electric system.

SUMMARY

Solar devices and methods for producing solar devices are disclosed. In some examples, a solar device includes solar cells arranged in a shingled manner such that adjacent long edges of adjacent ones of the solar cells overlap. The adjacent long edges have a non-linear shape that has protruding portions. The solar device includes contact pads arranged in the protruding portions of the adjacent long edges such that the contact pads of the adjacent ones of the solar cells are electrically connected. In some examples, a method includes dividing a photovoltaic wafer into solar cells each having at least one long edge having a non-linear shape that has protruding portions. The method includes disposing contact pads along the long edges. The method includes assembling the solar cells in a shingled manner into a solar device so that each solar cell overlaps an adjacent solar cell along respective long edges of the solar cell and the adjacent solar cell.

BRIEF DESCRIPTION OF THE DRAWINGS

FIGS. 3A-G illustrate an example process for producing a solar device of solar cells arranged in a shingled manner with the ends of adjacent solar cells overlapping along non-linear edges;

FIGS. 4A-G illustrate another example process for producing a solar device of solar cells arranged in a shingled manner with the ends of adjacent solar cells overlapping along non-linear edges;

DETAILED DESCRIPTION

Figure 1A:
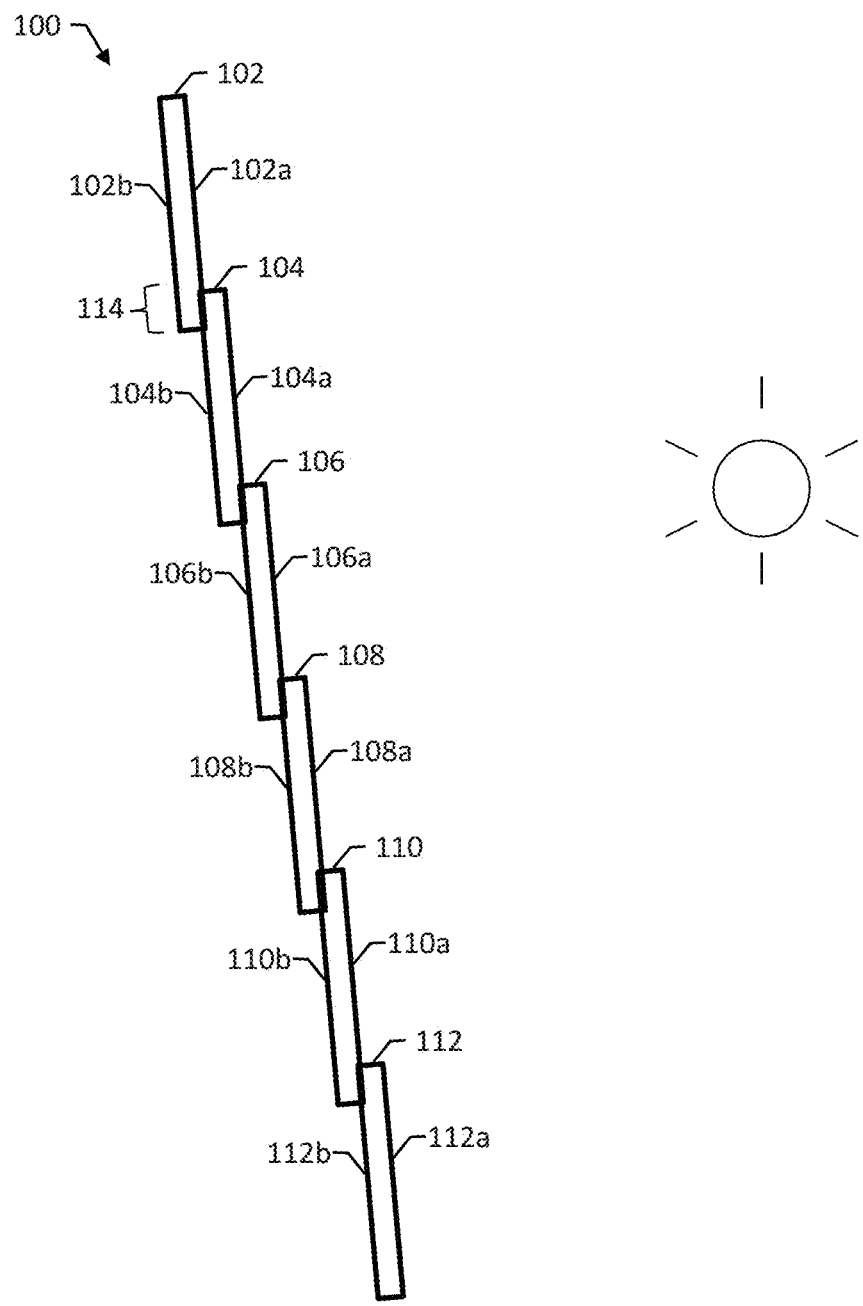
FIGS. 1A-B illustrate an example solar device of solar cells arranged in a shingled manner with the ends of adjacent solar cells overlapping along non-linear edges.
Figure 1B:
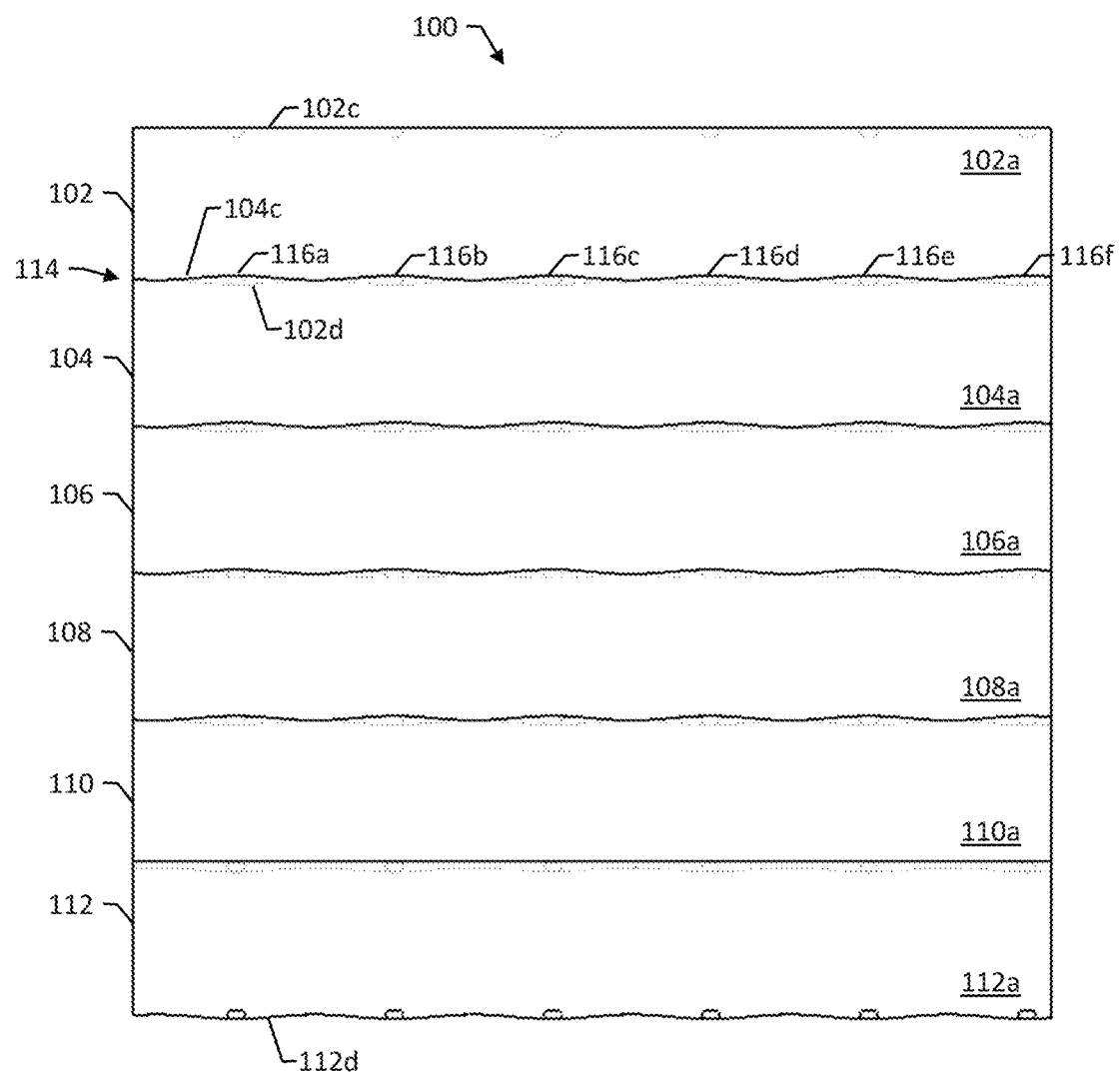

FIGS. 1A-B illustrate an example solar device 100 of solar cells arranged in a shingled manner with the ends of adjacent solar cells overlapping along non-linear edges. FIG. 1A shows a side view of the solar device 100 that illustrates the orientation of the solar device 100 towards the sun (or other light source such as mirrors facing the sun), and FIG. 1B shows a back view of the solar device 100 that illustrates the non-linear edges. The solar device 100 may be referred to as a "supercell" or a "hypercell" or a "solar cell strip."

Referring to FIG. 1A, the solar device 100 includes solar cells 102, 104, 106, 108, 110, and 112 arranged in a shingled manner with the ends or long edges of adjacent solar cells overlapping and electrically connected to form, e.g., a series-connected string. Each solar cell 102, 104, 106, 108, 110, and 112 has two relatively long edges and two relatively short edges. One or both of the long edges are non-linear and have a non-linear shape, as in one or both of the long edges, which extend between the short edges, is/are not arranged in a straight line between respective ends of the short edges. Each solar cell 102, 104, 106, 108, 110, and 112 can include a semiconductor diode structure and electrical contacts to the semiconductor diode structure. The solar cells are configured, by virtue of the semiconductor diode structures, so that electric current is generated in the solar cells when light shines on front surfaces 102*a*, 104*a*, 106*a*, 108*a*, 110*a*, and 112*a* of the solar cells. The electric current can then be provided to an external load.

For example, each solar cell 102, 104, 106, 108, 110, and 112 can be a crystalline silicon solar cell having a front (lighted side) surface 102*a*, 104*a*, 106*a*, 108*a*, 110*a*, and 112*a* and a rear (shaded side) surface 102*b*, 104*b*, 106*b*, 108*b*, 110*b*, and 112*b*. The front and rear surfaces can include surface metallization structures providing electrical contact to opposite sides of an n-p junction.

Any appropriate type of solar cells can be used in the solar device 100. For example, the front surface metallization structure can be disposed on a semiconductor layer of n-type conductivity, and the rear surface metallization structure can be disposed on a semiconductor layer of p-type conductivity. In another example, the front surface metallization structure can be disposed on a semiconductor layer of p-type conductivity, and the rear surface metallization structure can be disposed on a semiconductor layer of n-type conductivity.

In the solar device 100 of FIG. 1, adjacent solar cells are conductively bonded to each other in the region in which they overlap by an electrically conducting bonding material that electrically connects the front surface metallization structure of one solar cell to the rear surface metallization structure of the adjacent solar cell. For example, consider the first and second solar cells 102 and 104 in the solar device 100. The second solar cell 104 is adjacent to the first solar cell 102 and overlaps the first solar cell 102 in a region 114 where the first and second solar cells 102 and 104 are electrically connected.

Appropriate electrically conducting bonding materials may include, for example, electrically conducting adhesives and electrically conducting adhesive films and adhesive tapes, and conventional solders. In some examples, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon).

Referring to FIG. 1B, which is a back view of the solar device 100, the solar cells 102, 104, 106, 108, 110, and 112 have been shaped and shingled so that, where adjacent solar cells overlap, the solar cells overlap along non-linear edges, which are the long edges of the solar cells that extend in generally parallel directions. For purposes of illustration, FIG. 1B shows edges of the solar cells that face the viewer as dark lines, and FIG. 1B shows edges of solar cells that are hidden behind other solar cells in overlapping regions as light lines, as if the solar cells were transparent in those regions (i.e., FIG. 1B is an "x-ray" view). In this view, the viewer can see contact pads as circular shapes in the regions where adjacent solar cells overlap.

For example, consider the region 114 where the first and second solar cells 102 and 104 overlap. The top edge 104c of the second solar cell 104 extends between a first direction towards a top edge 102c of the solar device 100 and a second direction, opposite the first direction, towards a bottom edge 112d of the solar device 100. The bottom edge 102d of the first solar cell 102 extends between the same two directions but mirrors, in the same two directions, the top edge 104c of the second solar cell 104.

Because the bottom edge 102d mirrors the top edge 104c, the bottom edge 102d extends towards the first direction where the top edge 104c extends towards the second direction, and the bottom edge 102d extends towards the second direction where the top edge 104c extends towards the first direction. As a consequence of the non-linear edges, the bottom edge 102d of solar cell 102 and the top edge 104c of solar cell 104 have the largest overlapping area over the contact pads 116a-f and the smallest overlapping area at mid-points between those contact pads.

The non-linear edges have protruding portions, which are portions of the solar cell that protrude or extend away from a center of the solar cell, and recessing portions, which are portions of the solar cell that recess towards the center of the solar cell. The contact pads are located in the protruding portions of the solar cell and the protruding portions of one solar cell match with protruding portions of an adjacent solar cell. As such, contact pads provided in the protruding portions of the solar cells match or line up (e.g., in a row) and can be electrically connected with a conductive adhesive bonding material. The contacts pads can be discrete contact pads, i.e., such that each contact pad is a discrete electrical contact point between adjacent solar cells.

Using solar cells that overlap along non-linear edges can reduce, compared to using linear or straight edges, the amount of material needed to produce a solar device at a given power rating. In modules with straight edges, potential active area can be shaded due to overlap. For example, the entire area between discrete connection pads may be shaded by a top solar cell, just to accommodate space for the discrete connection pads.

To illustrate the potential for saving material, consider the following example. Suppose that each of the solar cells 102, 104, 106, 108, 110, and 112 has a length of about 156 mm and an average a width of about 26 mm. Also suppose that an overlap of 1.6 mm is required at the contact pads. Under these conditions, a 0.8 mm sinusoid pattern at the edges can reduce, compared to straight edges, average cell-to-cell overlap by up to half (0.8 mm) while still having the same overlap at the contact pads (1.6 mm).

Furthermore, consider a solar string having 83 solar cells with straight edges. By using solar cells that overlap along non-linear edges and reducing the average overlap from 1.6 mm to 0.8 mm, the material used can be reduced by up to 2.5 solar cells per string. In some examples, an equivalent solar string can use 81 solar cells instead of 83, without a reduction in string power.

The solar cells can be sized to any appropriate dimensions. In some examples, the solar cells each have a length of about 156 mm and an average width of about 26 mm, so that six solar cells can be prepared on a standard 156 mm×156 mm silicon wafer. In another example, eight solar cells having dimensions of about 19.5 mm×0.156 mm can be prepared from a standard silicon wafer. More generally, the solar cells can have aspect ratios of, for example, about 1:2 to about 1:20 and may be prepared from standard size wafers or from wafers of any other appropriate dimensions.

Figure 1C:
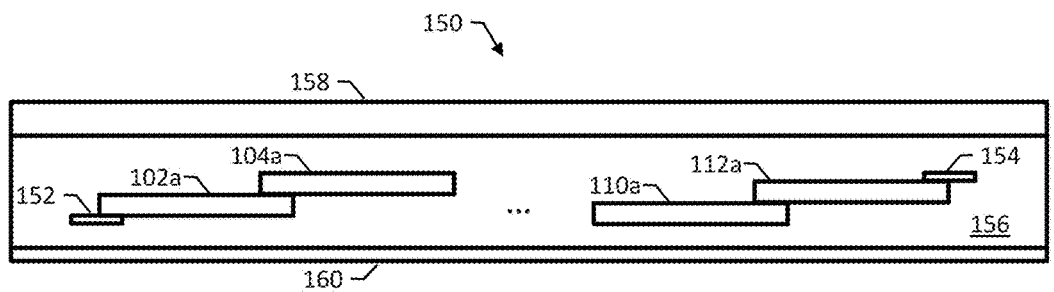
FIG. 1C is a side view of an example encapsulated solar device.

FIG. 1C is a side view of an example solar device that has been encapsulated into a solar module 150. The solar module 150 includes the solar cells 102, 104, 106, 108, 110, and 112 arranged in a shingled manner. The solar module 150 also includes conductive interconnects 152 and 154 at the ends of the solar cells that can be configured to connect the solar cells, e.g., to other solar cells or to an external load. Any appropriate electrical configuration can be used, e.g., combinations of serial and parallel connections.

The solar module 150 includes an encapsulant 156 encapsulating the solar cells. The encapsulant 156 can be a polymer, for example, a thermoplastic olefin polymer. The solar module 150 also includes a transparent front sheet 158 and a back sheet 160. The front sheet 158 can be, e.g., made of glass. The back sheet 160 can also be made of glass or made of a polymer. A solar module 150 including a glass front sheet 158 and a glass back sheet 160 may also be referred to as a glass-glass module or a bifacial module.

Figure 1D:
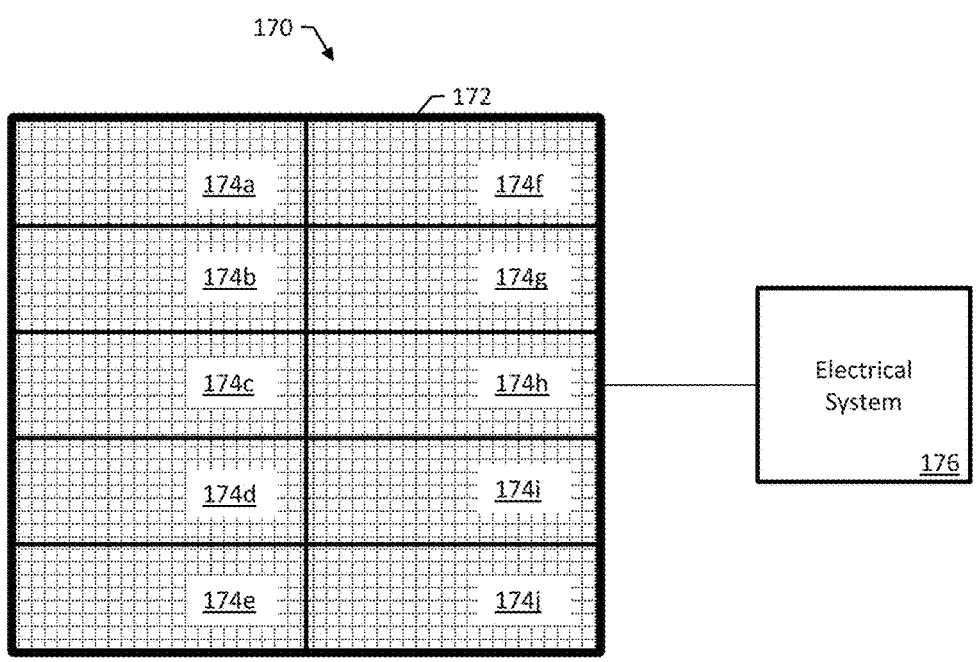
FIG. 1D shows an example solar array coupled to an electrical system.

FIG. 1D shows an example solar array 170 coupled to an electrical system 176. The solar array 170 is configured to provide power to the electrical system 176. The solar array 170 includes a frame 172 and a number of solar modules 174a-j mounted on the frame 172. Each of the solar modules 174a-j can be configured as the solar module 150 of FIG. 1C, for example. The solar modules 174a-j are electrically connected as a combination of serial and/or parallel electrical connections, depending on the system design, to provide a common output to the electrical system 176.

Figure 2A:
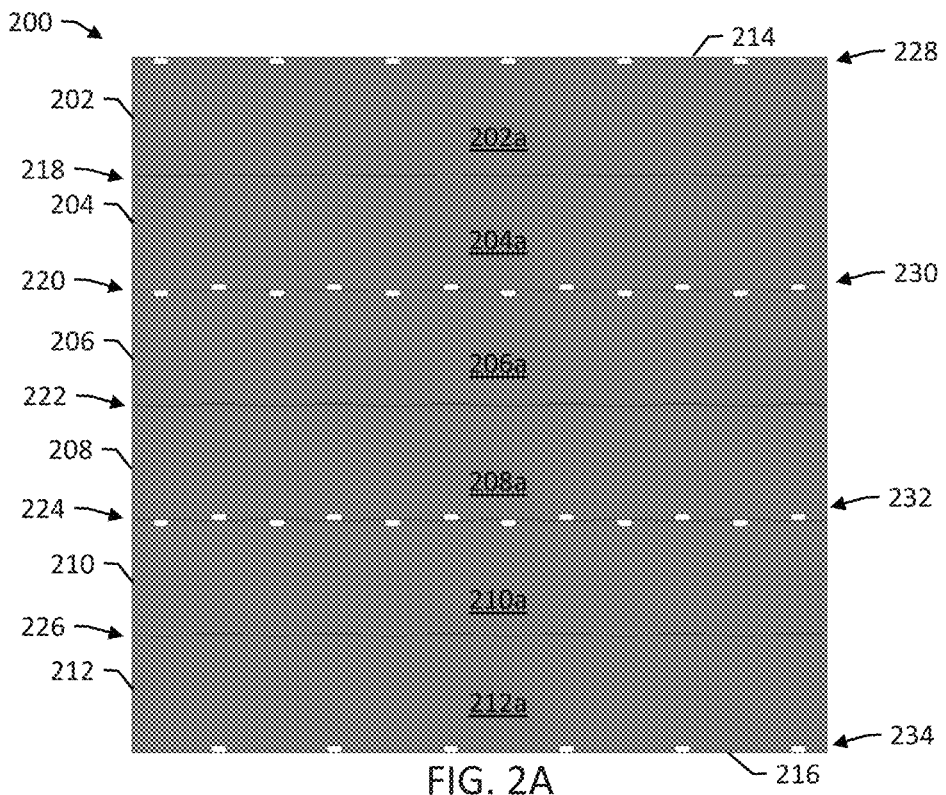
FIGS. 2A-B illustrate an example photovoltaic wafer that can be divided into solar cells that are arranged in a shingled manner with the ends of adjacent solar cells overlapping along non-linear edges.
Figure 2B:
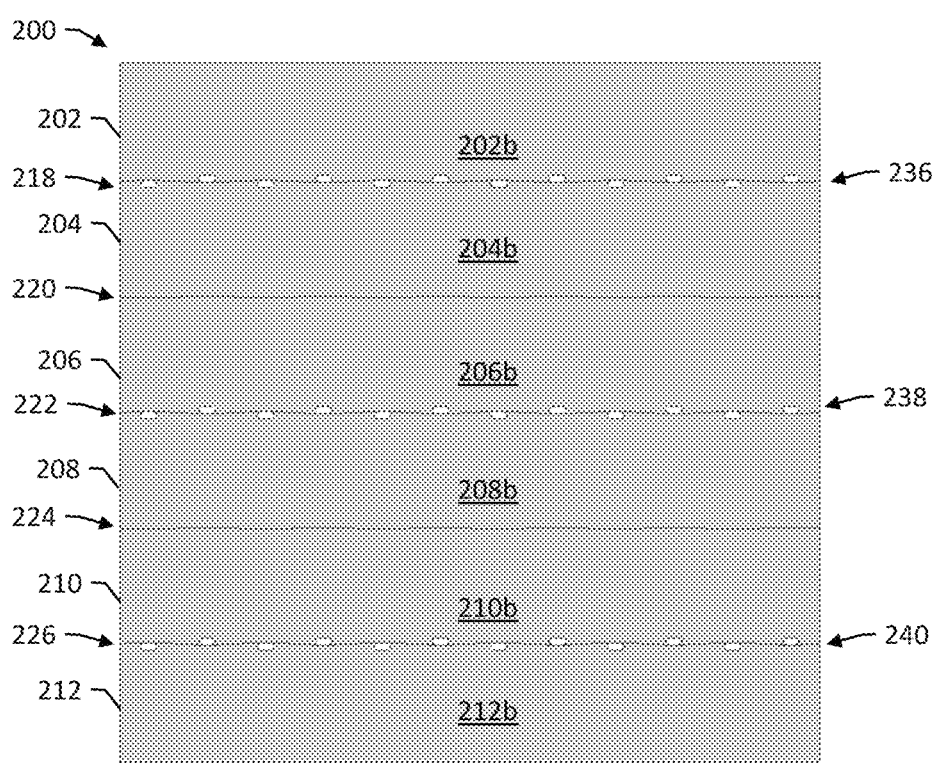

FIGS. 2A-B illustrate an example photovoltaic wafer 200 that can be divided into solar cells shaped for arrangement in a shingled manner with the ends of adjacent solar cells overlapping along non-linear edges. The wafer 200 includes six regions 202, 204, 206, 208, 210, and 212 that will be solar cells when the wafer 200 is divided along five non-linear scribe lines 218, 220, 222, 224, and 226. The wafer 200 also includes a straight top edge 214 and a straight bottom edge 216.

Six regions are shown for purposes of illustration; in general, any appropriate number of regions can be used. Typically, the regions 202, 204, 206, 208, 210, and 212 each have a long edge and a short edge and are arranged to overlap at the long edges; however, the regions can have any appropriate dimensions. Scribe lines are shown for purposes of illustration even though they may not be necessary in some examples depending on the method used to divide the wafer 200.

FIG. 2A is a front view of the wafer 200 that shows front surfaces 202a, 204a, 206a, 208a, 210a, and 212a of the regions 202, 204, 206, 208, 210, and 212. Four rows of contact pads 228, 230, 232, and 234 are disposed on the front of the wafer 200. The top row 228 is a straight row that follows the straight top edge 214, and the bottom row 234 is a straight row that follows the straight bottom edge 216.

The interior rows 230 and 232 follow two of the interior non-linear scribe lines 220 and 224, e.g., as described further below with reference to FIG. 2C. So, on the front of the wafer 200, the rows of contact pads 228, 230, 232, and 234 are disposed in an alternating fashion along the along the non-linear scribe lines 218, 220, 222, 224, and 226, i.e., every other scribe line has a row of contact pads disposed along the scribe line.

FIG. 2B is a back view of the example wafer 200 that shows back surfaces 202b, 204b, 206b, 208b, 210b, and 212b of the regions 202, 204, 206, 208, 210, and 212. Three rows of contact pads 236, 238, and 240 are disposed on the back of the wafer 200. The rows 236, 238, and 240 follow the three interior non-linear scribe lines 218, 222, and 226 that do not have contact pads on the front of the wafer 200. So, on the back of the wafer 200, the rows of contact pads 236, 238, and 240 are disposed in an alternating fashion along the along the non-linear scribe lines 218, 222, and 226, i.e., every other scribe line has a row of contact pads disposed along the scribe line.

Figure 2C:
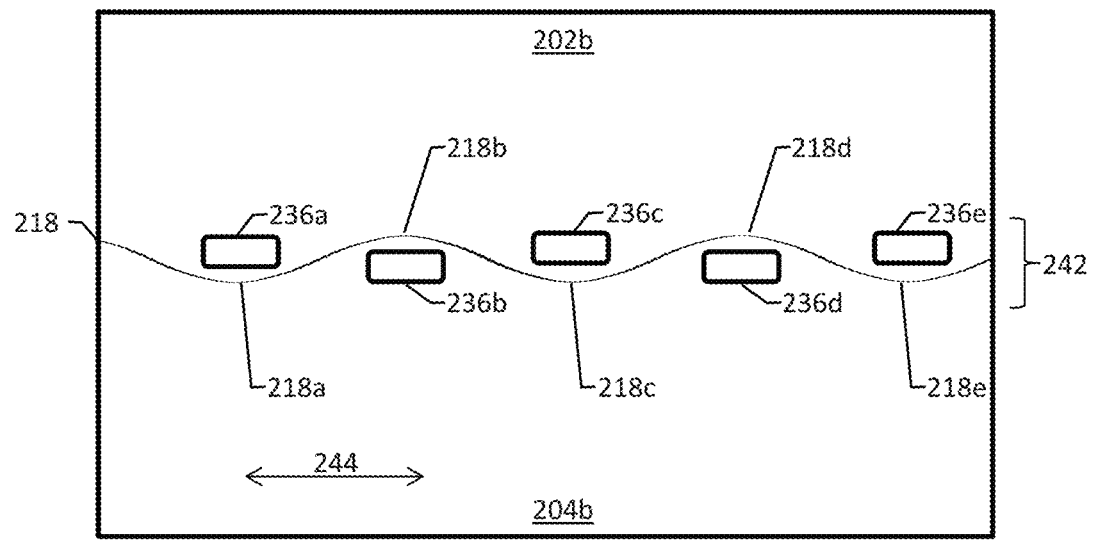
FIG. 2C shows a closer, cut-away view of an non-linear scribe line.

FIG. 2C shows a closer, cut-away view of the scribe line 218 separating the top region 202 from the adjacent region 204 below the top region 204 on the back of the wafer 200. The scribe line 218 is a sinusoid that extends between a direction towards the top region 202 and a direction towards the adjacent region 204 below the top region 202. Where the scribe line 218 reaches troughs 218a, 218c, and 218e, contact pads 236a, 236c, and 236e are disposed above the troughs 218a, 218c, and 218e on the back surface 202b of the top region 202. Where the scribe line 218 reaches peaks 218b and 218d, contact pads 236b and 236d are disposed below the peaks 218b and 218d on the back surface 204b of the adjacent region 204 below the top region 202.

In general, the contact pads 236a-e are disposed laterally along the scribe line 218 at equal distances, where the distances are equal to the lateral peak-to-trough distance 244 (e.g., 3 mm to 30 mm) of the scribe line 218. The contact pads 236a-e alternate between two vertical positions. The vertical positions depend on the vertical peak-to-trough distance 242 of the scribe line 218 and the dimensions of the contact pads 236a-e.

In some examples, the contact pads 236a-e are square or have a rectangular shape elongated parallel or substantially parallel (i.e., within 5 or 10 degrees) to the top and bottom edges 214 and 216 of the wafer. The contact pads 236a-e may have widths perpendicular to the long side of the wafer 200 of about 1 mm to about 5 mm, for example, and lengths parallel to the long side of the wafer 200 of about 1 mm to about 10 mm for example. The contact pads 236a-e may each have a surrounding barrier acting as a dam to form a moat between the contact pad and the barrier. Portions of uncured conductive adhesive bonding material that flow off of the contact pads 236a-e, or that miss the contact pads when dispensed, may be confined to the moats.

In an example, each of the scribe lines 218, 220, 222, 224, and 226 follows a sinusoidal pattern having a number of periods based on a designed number of contact pads in a row and a vertical peak-to-trough distance based on the size of the contact pads. The shape of the scribe lines 218, 220, 222, 224, and 226 is also configured so that the wafer 200 can be cleaved along the scribe lines, e.g., so that the wafer 200 cleaves cleanly with a particular yield loss in a particular manufacturing setting. The sinusoids are mirrored, i.e., offset in phase in an alternating fashion, so that each scribe line is rising while its neighboring scribe lines are falling.

Figure 2D:
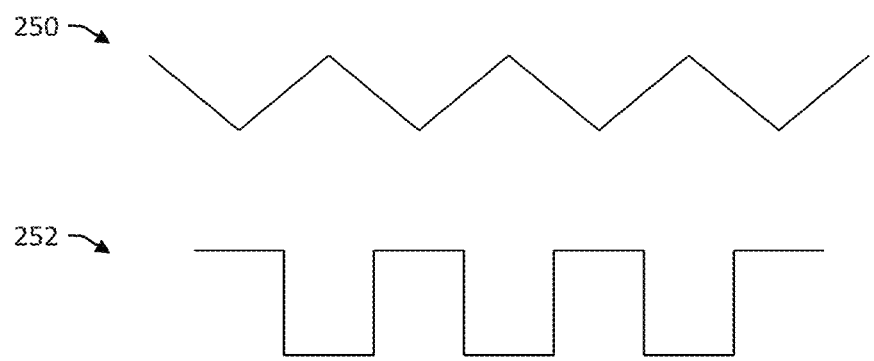
FIG. 2D illustrates two example non-sinusoidal patterns.

In some examples, the scribe lines 218, 220, 222, 224, and 226 follow a non-sinusoidal pattern that extends between a first direction towards the top edge 214 of the wafer 200 and a second direction towards the bottom edge 216 of the wafer 200. The pattern is a repeating pattern that has a defined number of periods and peak-to-trough amplitude. FIG. 2D illustrates two example non-sinusoidal patterns 250 and 252. The first pattern 250 is a triangle wave. The second pattern 252 is a square wave. The square wave may not be useful in manufacturing settings where the wafer 200 is scribed and cleaved since it may not cleave acceptably, but the square wave pattern can be used in some other examples, e.g., where the wafer 200 is sawed.

In some aspects, one or more of the scribe lines 218, 220, 224, and 226 are non-linear. That is, the wafer 200 can be scribed with non-linear or non-straight scribe lines to result in non-linear or non-straight edged solar cell strips. In an example, outer solar cell strips can have linear or straight edges that are not scribed or cleaved, whereas inner solar cell strips can have non-linear or non-straight scribed or cleaved edges. These non-linear edges can have a non-linear shape that is not straight. In an example, the non-linear edges are undulated or have undulated portions. In an example, the non-linear shape can have a periodic waveform shape. This periodic waveform shape can be sinusoidal, square, rectangular, triangular, sawtooth, or a combination thereof where the undulated portions take the shape of one or more of the peaks and valleys of a sinusoidal, square, rectangular, triangular, or sawtooth pattern. The non-linear shape can also have a non-periodic waveform shape. The non-linear shape can be a combination of periodic waveform shapes. The non-linear shape can be symmetrical or non-symmetrical with respect to any axis thereof. Further, the non-linear shape can have linear portions that are straight and are interrupted by undulated portions or a protruding portion. The protruding portion can have a smooth or jagged shape that is not wavy. In an example, one or more of the scribe lines 218, 220, 224, and 226 can be non-linear and include portions that are non-linear and linear.

FIGS. 3A-G illustrate an example process for producing a solar device from the wafer 200 of FIGS. 2A-B. The process can be performed, e.g., by a manufacturing system including a shingling robot. The wafer 200 is scribed, pasted (such as paste printed), and cleaved along the non-linear scribe lines. Then the robot arranges the remaining solar cell strips in a shingled manner with the ends of adjacent strips overlapping along the non-linear edges. The robot rotates every other strip by 180 degrees.

For purposes of illustration, each of the strips is labelled with a number from one to six. As shown in FIGS. 3A-G, the numbers rotate with the strips (i.e., the numbers maintain their orientation with respect to the strips) to illustrate the robot rotating every other strip by 180 degrees. The strips that remain after cleaving are shown on the left side, and the strips that have been picked, rotated (if appropriate in view of rotating every other strip), and shingled into the solar device are shown on the right side.

Figure 3A:
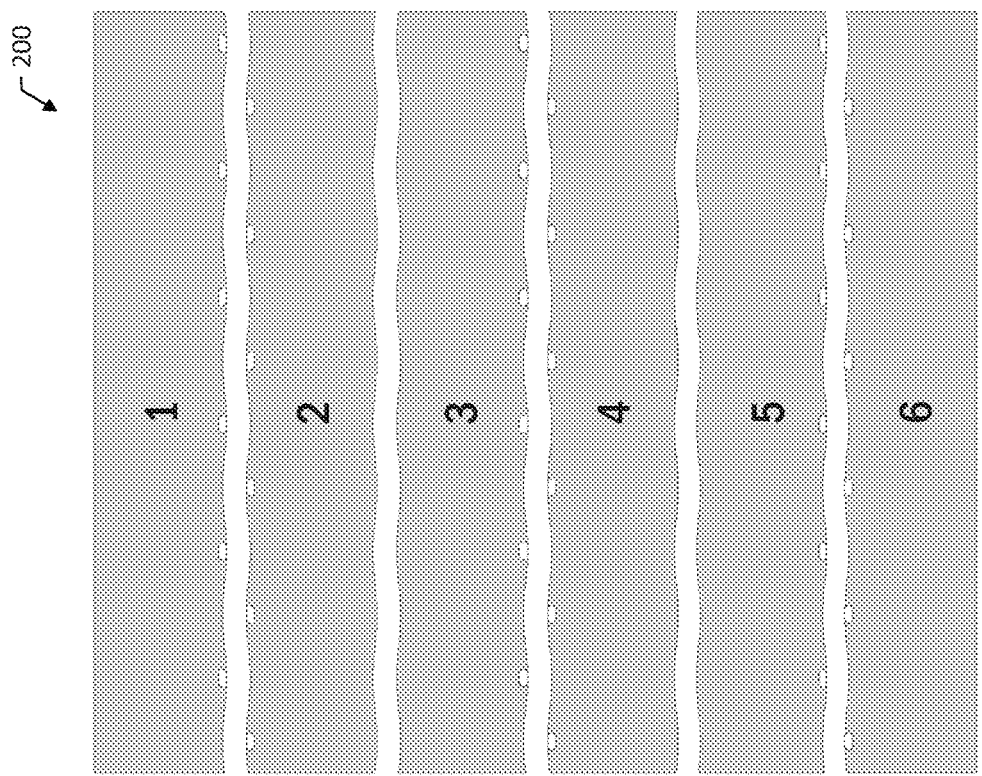
Figure 3B:
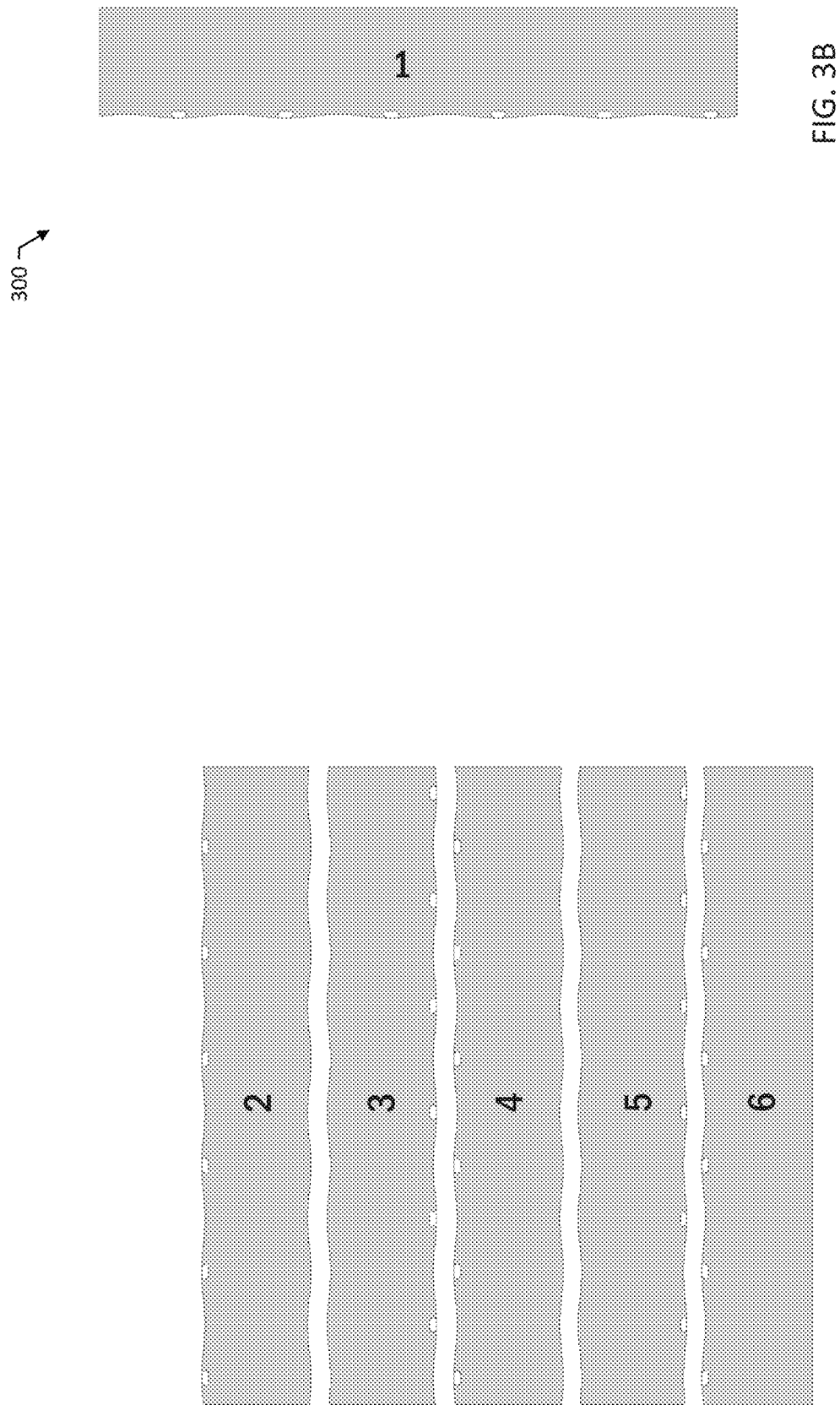

FIG. 3A shows the wafer 200 after the wafer 200 has been cleaved along the non-linear scribe lines and before the robot has picked any of the remaining strips. FIG. 3B shows the solar device 300 after the robot has picked and placed strip 1 (e.g., onto a cure belt). FIG. 3C shows the solar device 300 after the robot has picked strip 2, rotated strip 2 by 180 degrees, and shingled strip 2 onto strip 1. FIG. 3D shows the solar device 300 after the robot has picked strip 3 and shingled strip 3 onto strip 2.

Figure 3E:
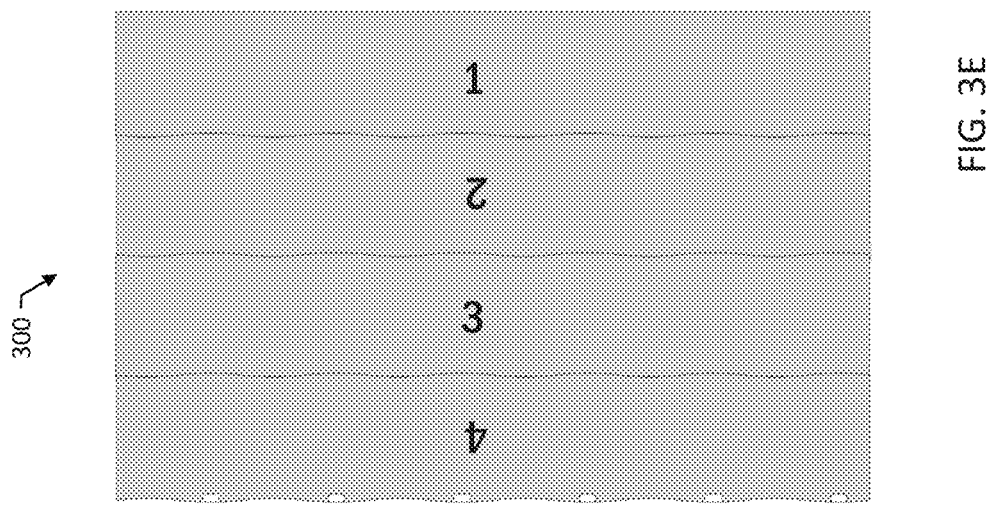
Figure 3E:
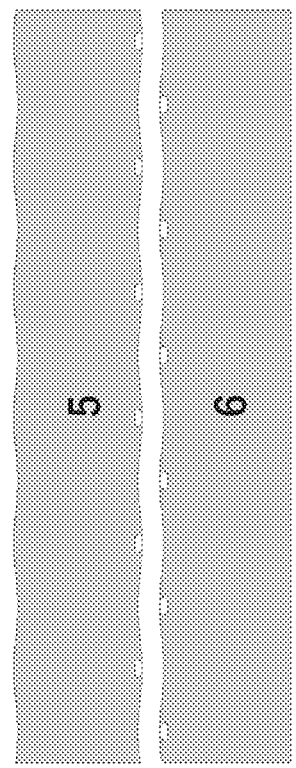
Figure 3F:
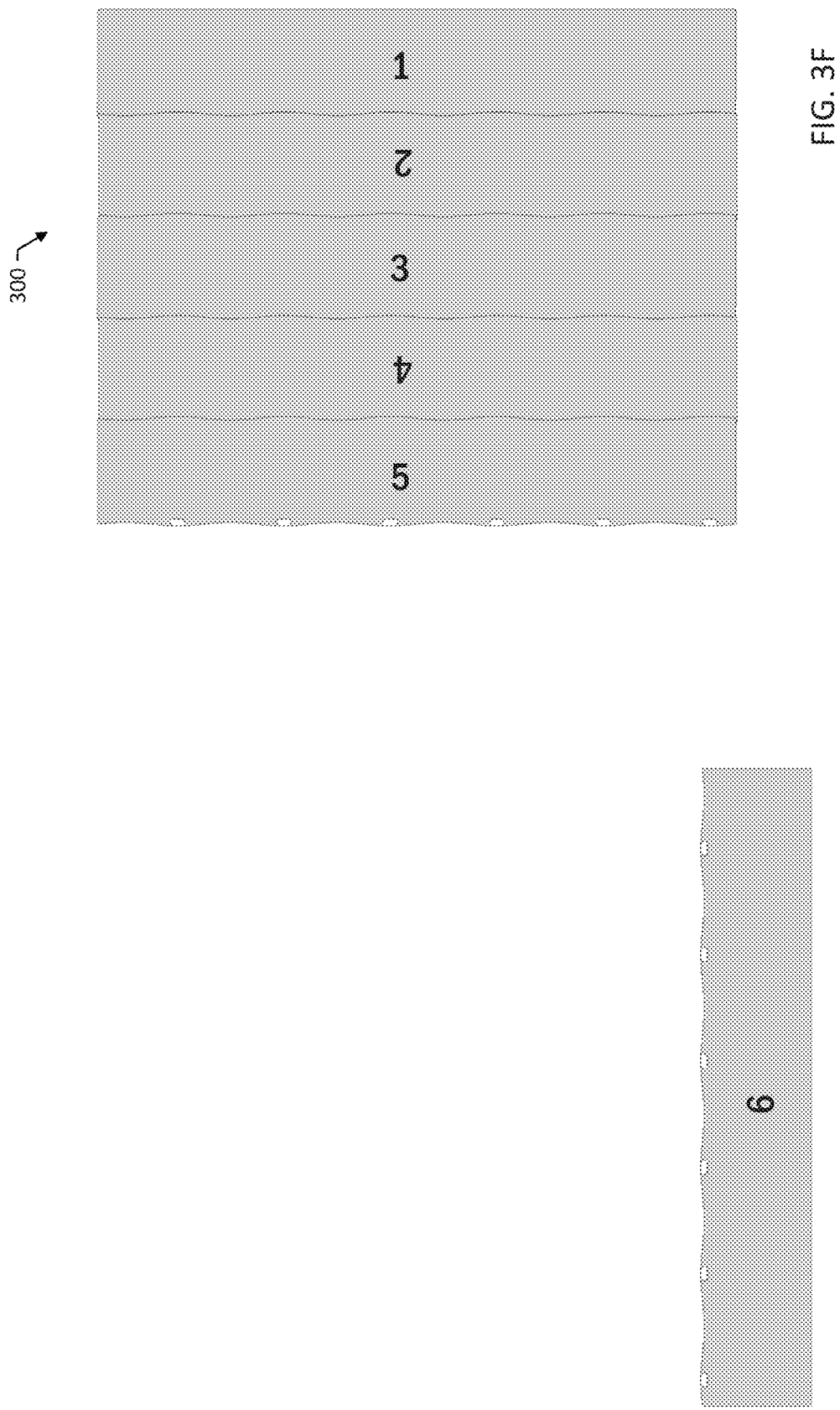
Figure 3G:
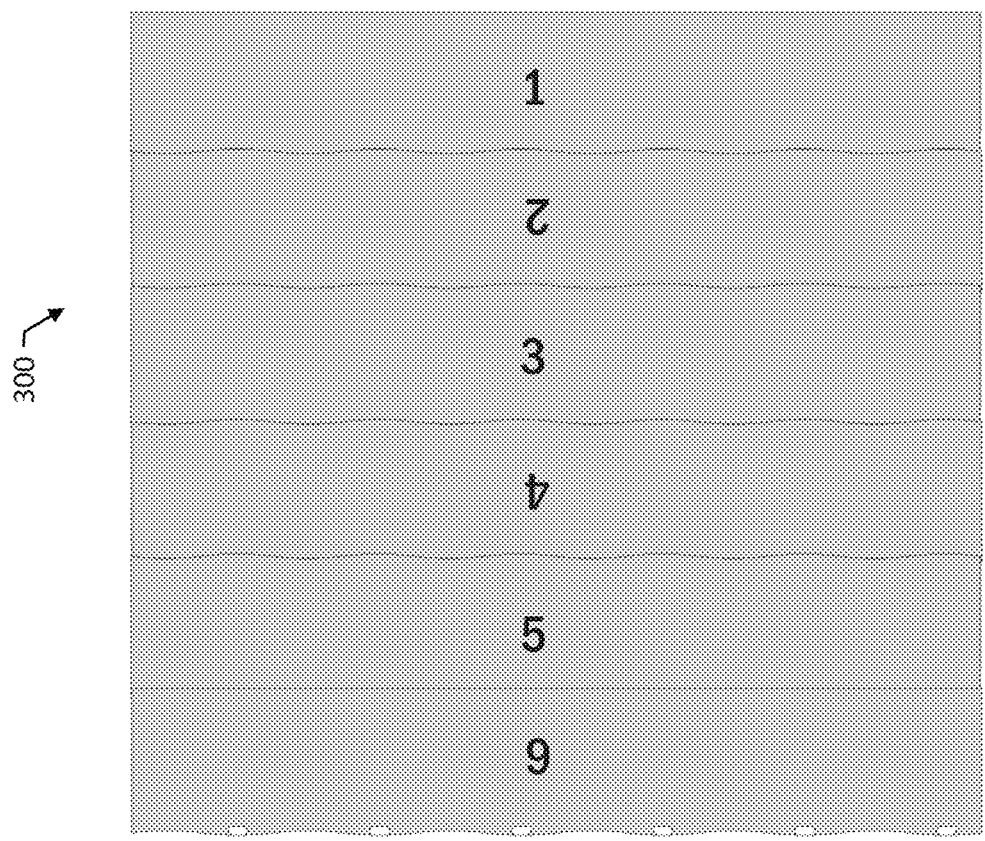

FIG. 3E shows the solar device 300 after the robot has picked strip 4, rotated strip 4 by 180 degrees, and shingled strip 4 onto strip 3. FIG. 3F shows the solar device 300 after the robot has picked strip 5 and shingled strip 5 onto strip 4. FIG. 3G shows the solar device 300 after the robot has picked strip 6, rotated strip 6 by 180 degrees, and shingled strip 6 onto strip 5. The resulting solar device 300 has a configuration corresponding to the solar device 100 depicted in FIGS. 1A-B.

FIGS. 4A-G illustrate another example process for producing a solar device from the wafer 200 of FIGS. 2A-B. The process can be performed, e.g., by a manufacturing system including first and second shingling robots. The wafer 200 is scribed, paste printed, and cleaved along the non-linear scribe lines. Then the robots arrange the remaining solar cell strips in a shingled manner with the ends of adjacent strips overlapping along the non-linear edges. The robots pick every other strip and produce first and second solar devices 402 and 404, which can avoid the 180 degree rotation illustrated in FIGS. 3A-G.

For purposes of illustration, each of the strips is labelled with a number from one to six. As shown in FIGS. 4A-G, the numbers rotate with the strips (i.e., the numbers maintain their orientation with respect to the strips) to illustrate the placement for shingling along the non-linear edges. The strips that remain after cleaving are shown on the left side, and the strips that have been picked and placed are shown on the right side.

Figure 4A:
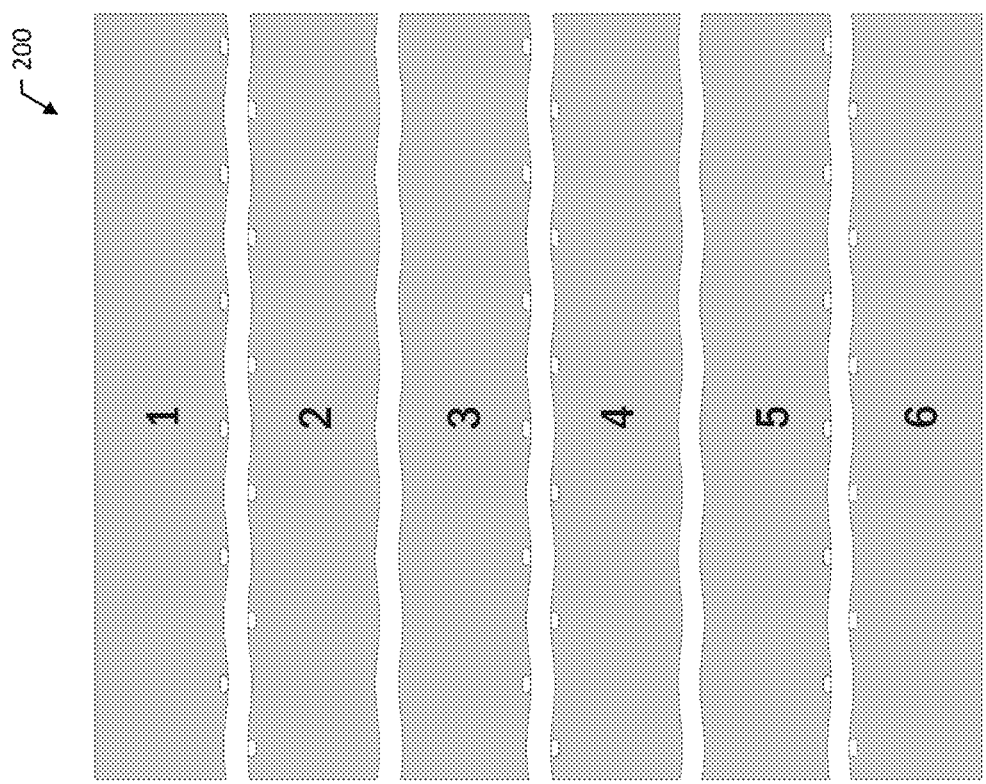
Figure 4B:
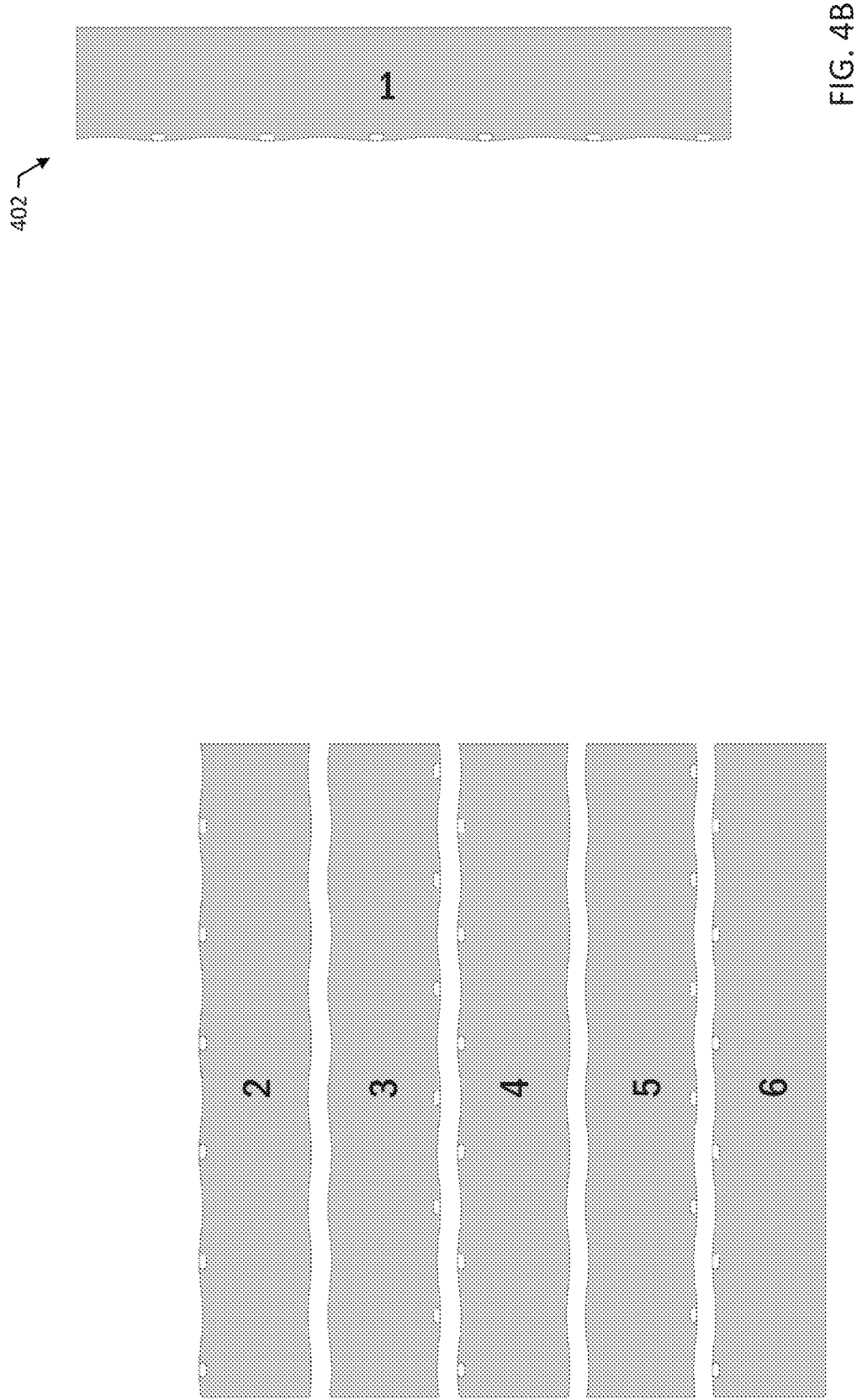
Figure 4C:
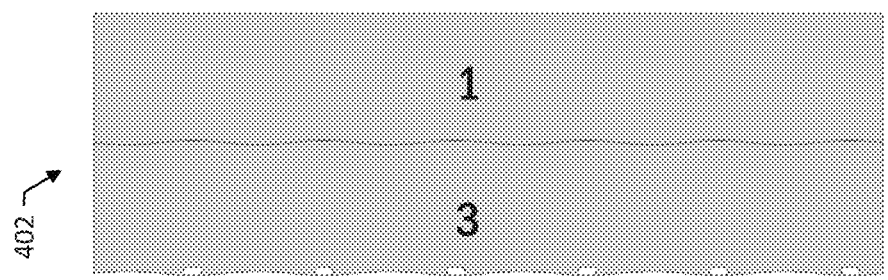
Figure 4C:
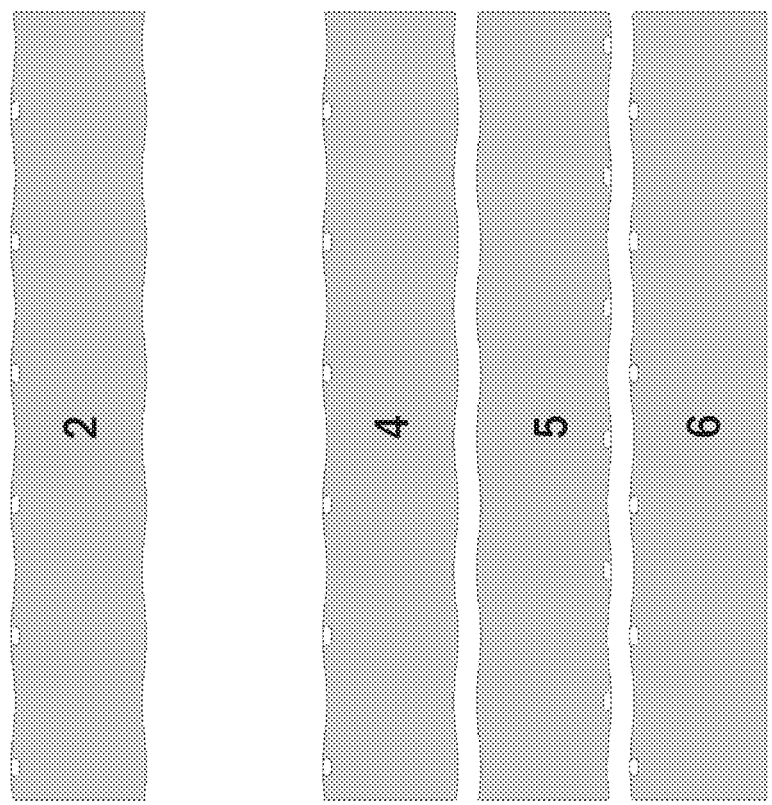
Figure 4D:
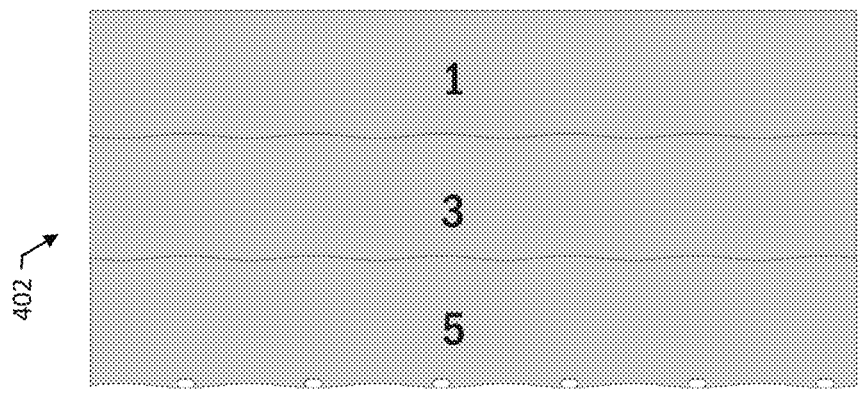
Figure 4D:
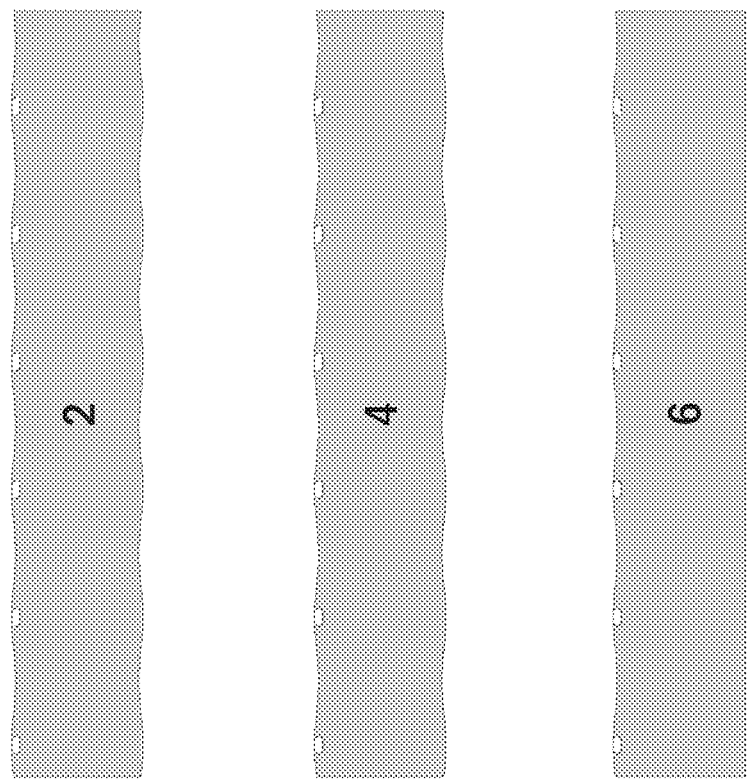

FIG. 4A shows the wafer 200 after the wafer 200 has been cleaved along the non-linear scribe lines and before the robots have picked any of the remaining strips. FIG. 4B shows the first solar device 402 after the first robot has picked and placed strip 1 (e.g., onto a cure belt). FIG. 4C shows the first solar device 402 after the first robot has picked strip 3 and shingled strip 3 onto strip 1. FIG. 4D shows the first solar device 402 after the robot has picked strip 5 and shingled strip 5 onto strip 3.

Figure 4E:
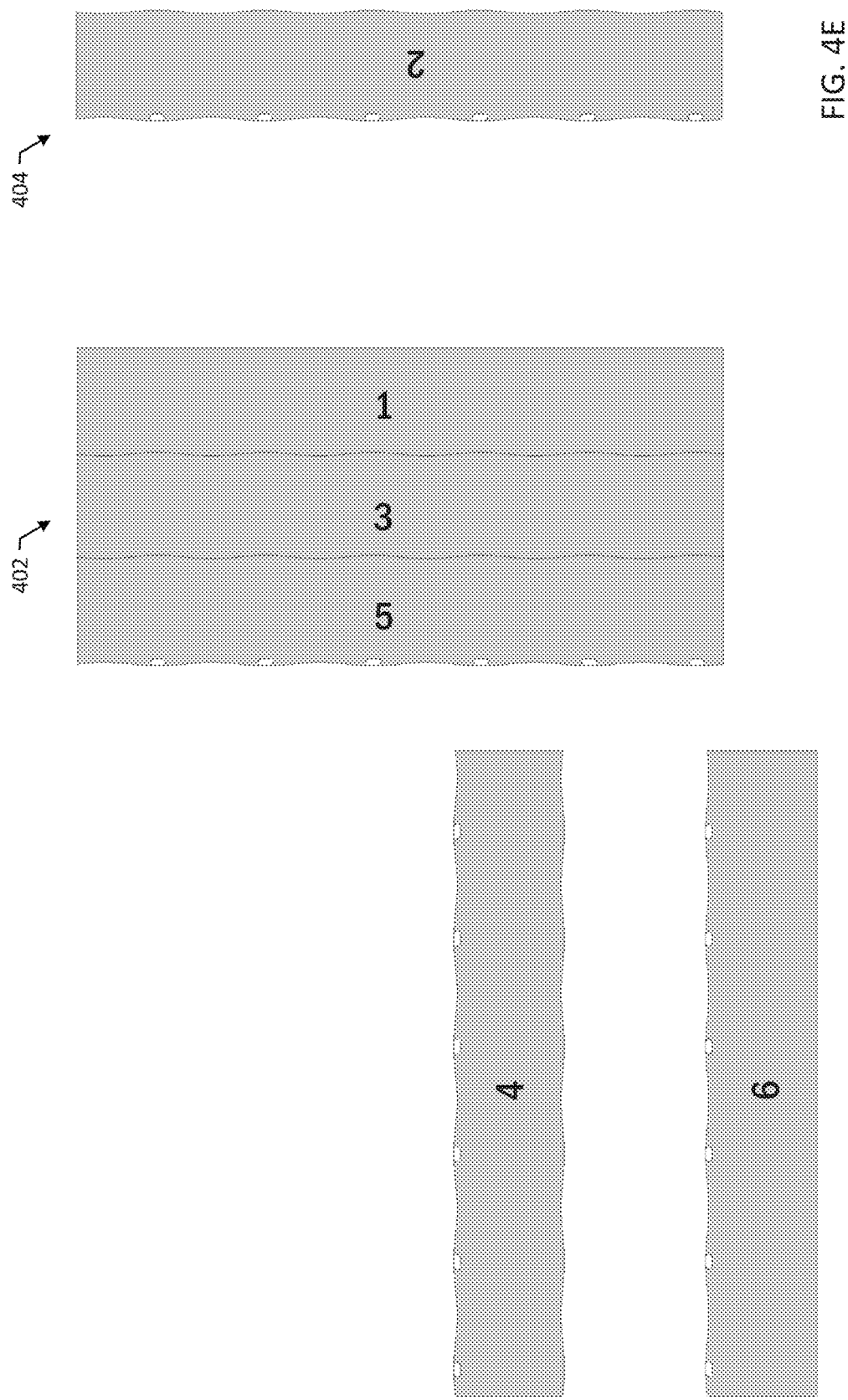
Figure 4F:
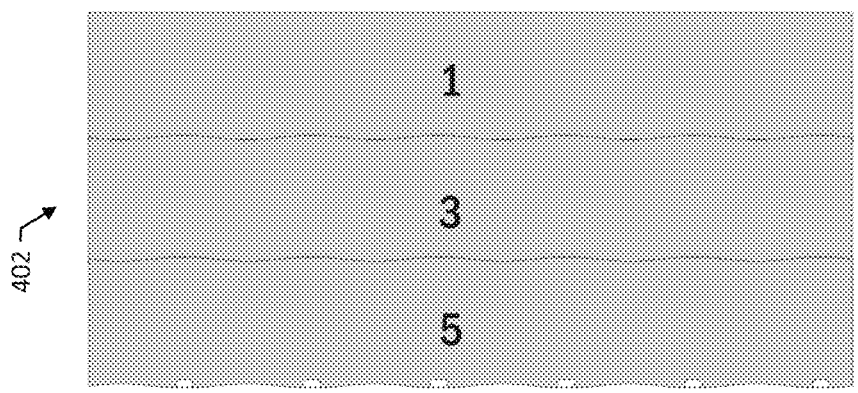
Figure 4F:
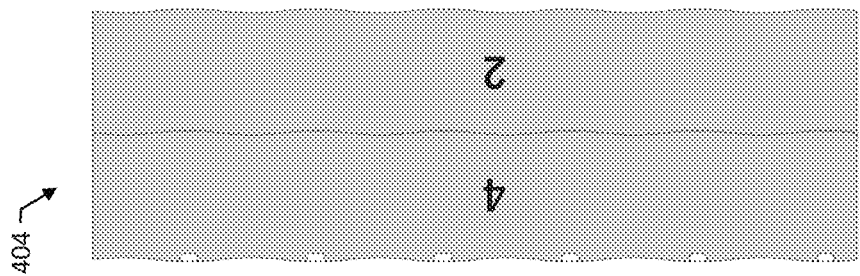
Figure 4F:
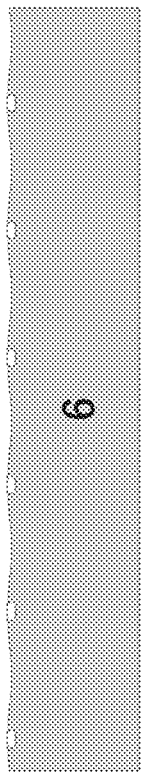

FIG. 4E shows the second solar device 404 after the second robot has picked and placed strip 2 (e.g., onto a cure belt). FIG. 4F shows the second solar device 404 after the robot has picked strip 4 and shingled strip 4 onto strip 2. FIG. 4G shows the second solar device 404 after the robot has picked strip 6 and shingled strip 6 onto strip 4. The process can be continued with one or more other wafers to build the solar devices 402 and 404 to a particular number of strips.

Figure 5:
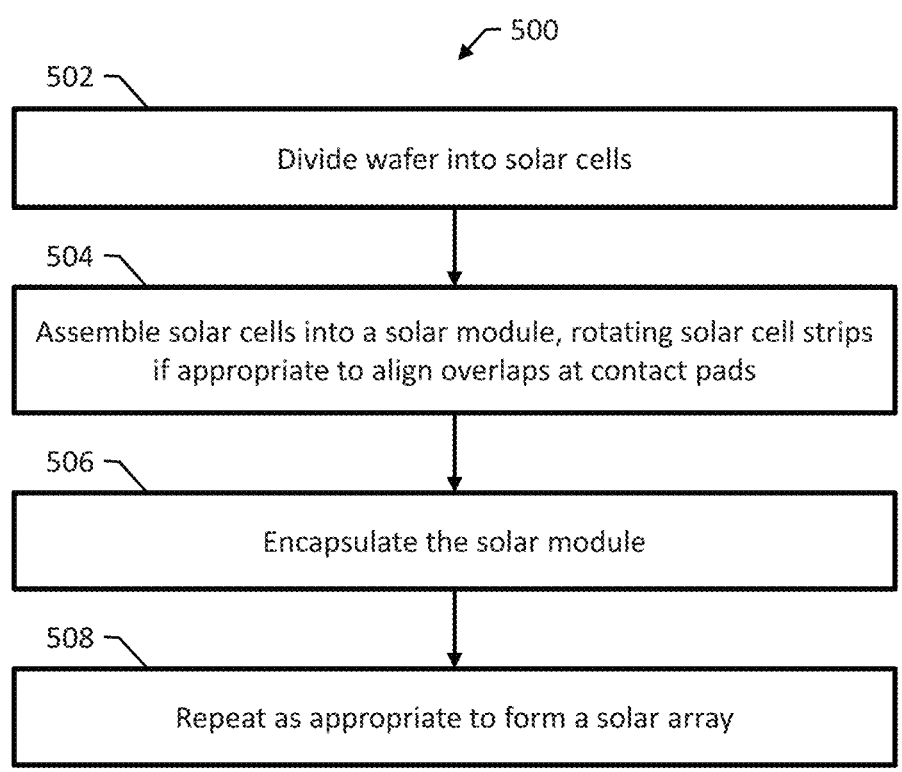
FIG. 5 is a flow diagram of an example method for producing a solar device of solar cells arranged in a shingled manner with the ends of adjacent solar cells overlapping along non-linear edges.

FIG. 5 is a flow diagram of an example method 500 for producing a solar device of solar cells arranged in a shingled manner with the ends of adjacent solar cells overlapping along non-linear edges. The method 500 includes dividing 502 a photovoltaic wafer, such as the example wafer 200 of FIGS. 2A-B, to form solar cells. For example, dividing the wafer can include scribing (e.g., laser scribing) the wafer to form non-linear scribe lines as described above with reference to FIGS. 2A-B and cleaving the wafer along the non-linear scribe lines.

The method 500 can optionally include testing and sorting the resulting solar cells according to their current-voltage performance. In some examples, the method 500 includes using solar cells with matching or approximately matching current-voltage performance in the same solar device or in the same row of series connected modules.

The method 500 includes assembling 504 the solar cells in a shingled manner with the ends of adjacent solar cells overlapping along non-linear edges. For example, the method 500 can include rotating, by a robot, every other strip as described above with reference to FIGS. 3A-G. In another example, the method 500 can include picking, by two robots, every other strip and producing two solar devices as described above with reference to FIGS. 4A-G.

Assembling the solar cells can include disposing a conductive adhesive bonding material onto contact pads between overlapping portions of adjacent solar cells, e.g., before or after dividing the wafer. Disposing the conductive adhesive can include, e.g., ink jet printing or screen printing. In some examples, assembling the solar cells can include applying heat and pressure to cure or partially cure the conductive adhesive bonding material between the solar cells in the solar device.

In some examples, as each additional solar cell is added to the solar device, the conductive adhesive bonding material between the newly added solar cell and its adjacent overlapping solar cell (which has already been placed) is cured or partially cured, before the next solar cell is added to the solar device. In another example, assembling the solar cells includes positioning more than two solar cells or all solar cells in the desired overlapping manner before the conductive adhesive bonding material is cured or partially cured.

The method 500 optionally includes encapsulating 506 the solar device into a layered structure including encapsulant material, a transparent front sheet, and a back sheet. The layered structure can include, e.g., a first layer of encapsulant on a glass substrate, with the shingled solar cells arranged sun-side down on the first layer of encapsulant; a second layer of encapsulant on the shingled solar cells; and a back sheet on the second layer of encapsulant. Any other appropriate arrangement may also be used. The method 500 optionally includes repeating 508 the dividing 502, assembling 504, and encapsulating 506 to form a number of solar devices and assembling the solar devices into a solar array, e.g., the solar array 170 of FIG. 1D.

Figure 6:
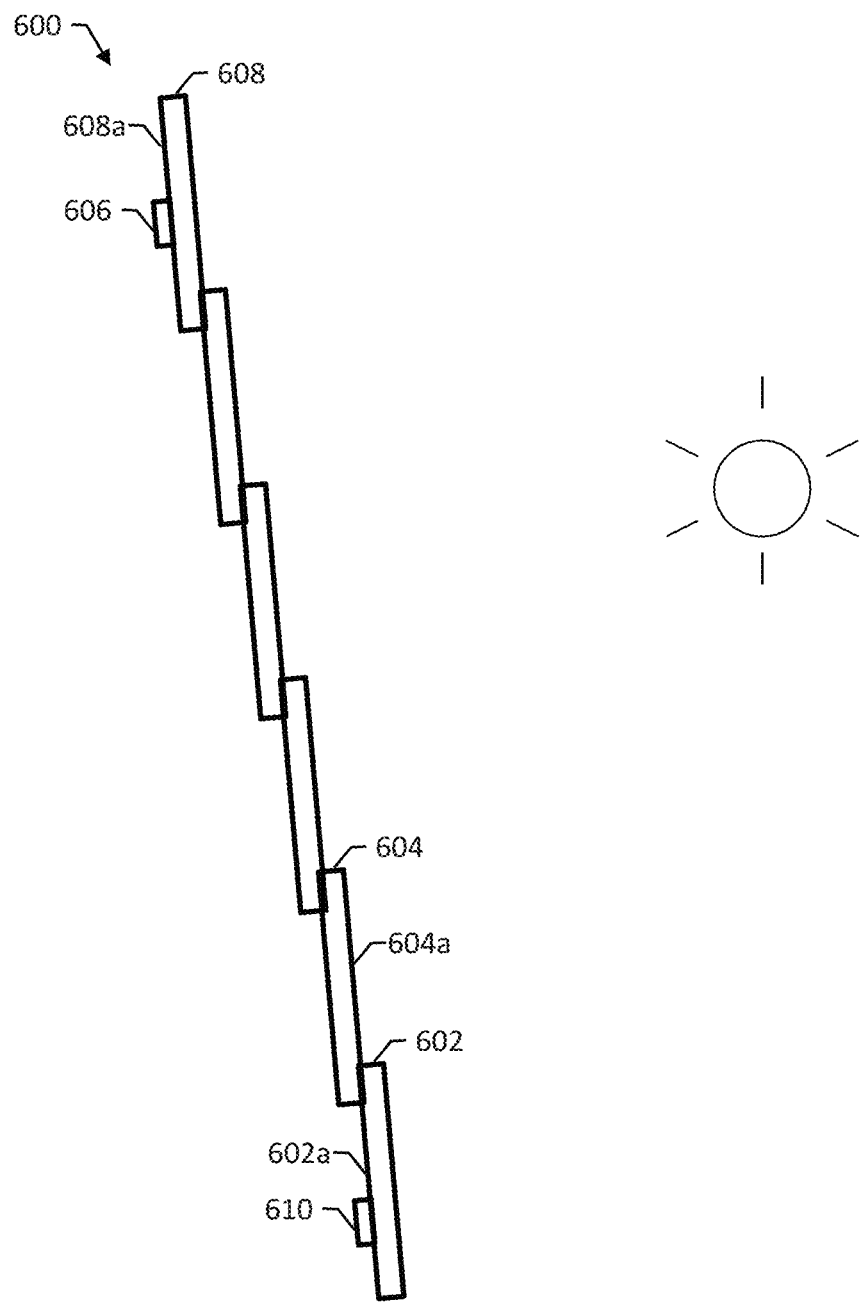
FIG. 6 illustrates an example solar device of solar cells arranged in a shingled manner with a sacrificial solar cell.

FIG. 6 illustrates an example solar device 600 of solar cells arranged in a shingled manner with a sacrificial solar cell 602. The sacrificial solar cell 602 overlaps a front surface 604a of an end one 604 of the adjacent solar cells and is conductively bonded to the front surface 604a of the end one 604 of the adjacent solar cells to electrically and mechanically connect a rear surface 602a of the sacrificial solar cell 602 in series with the adjacent solar cells.

The solar device includes a first conductive lead 606 conductively bonded to a rear surface 608a of a solar cell 608 located at an opposite end of the solar device 600 from the sacrificial solar cell 602. The first conductive lead is configured to provide, during operation of the solar device 600, a first electrical output from the solar device 600 having a first polarity. The solar device 600 also includes a second conductive lead 610 conductively bonded to the rear surface 602a of the sacrificial solar cell 602 and configured to provide, during operation of the solar device 600, a second electrical output from the solar device 600 having a second polarity opposite from the first polarity.

The sacrificial cell 602 is configured, by virtue of the second conductive lead 610 being conductively bonded to the rear surface 602a of the sacrificial solar cell 602, to contribute no power to a module-level electrical output of the solar device 600 during operation of the solar device 600. For example, the sacrificial cell 602 can be "sacrificial" in the sense that, in operation of the solar device 600, the sacrificial cell 602 can be manufactured by a same process as the other solar cells yet contribute no power because electrical contact is made only to the rear surface 602a of the sacrificial solar cell 602.

In some examples, the sacrificial solar cell 602 lacks a front surface metallization that is present on other solar cells in the solar device 600. In some other examples, the sacrificial solar cell and the other solar cells in the solar device 600 each have identical front and rear surface metallization. In some examples, the sacrificial solar cell 602 is a rejected solar cell that fails a screening test passed by other solar cells in the solar device 600.

The sacrificial cell 602 can have an outer edge positioned away from the solar device 600 that includes protrusions lying in the plane of the sacrificial cell that protrude away from the solar device 600 along the line of the solar device 600, and rear surface contact pads each of which is located on a rear surface of a corresponding protrusion. The second conductive lead 610 can then be bonded to the contact pads. Examples of sacrificial solar cells and solar devices including sacrificial solar cells are described in U.S. Provisional Application 62/267,101, filed on Dec. 14, 2015, which is hereby incorporated by reference.

Figure 7A:
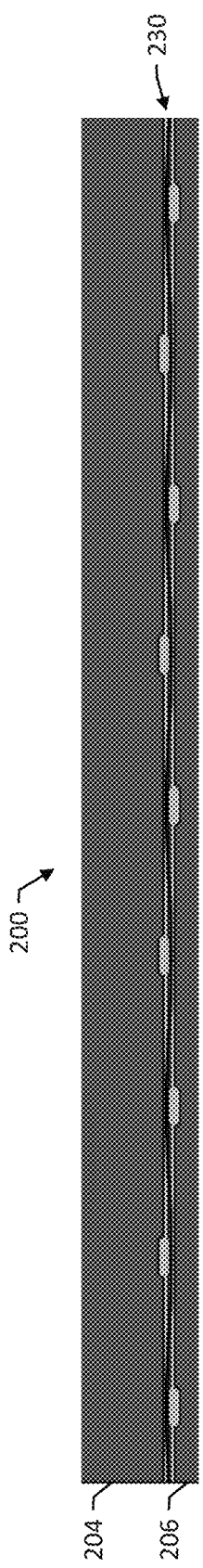
FIGS. 7A-C illustrate a conductive busbar that can be used in shingled solar cell devices.
Figure 7B:
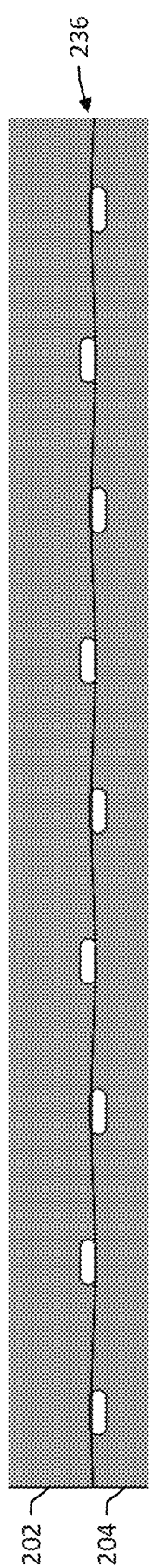
Figure 7C:
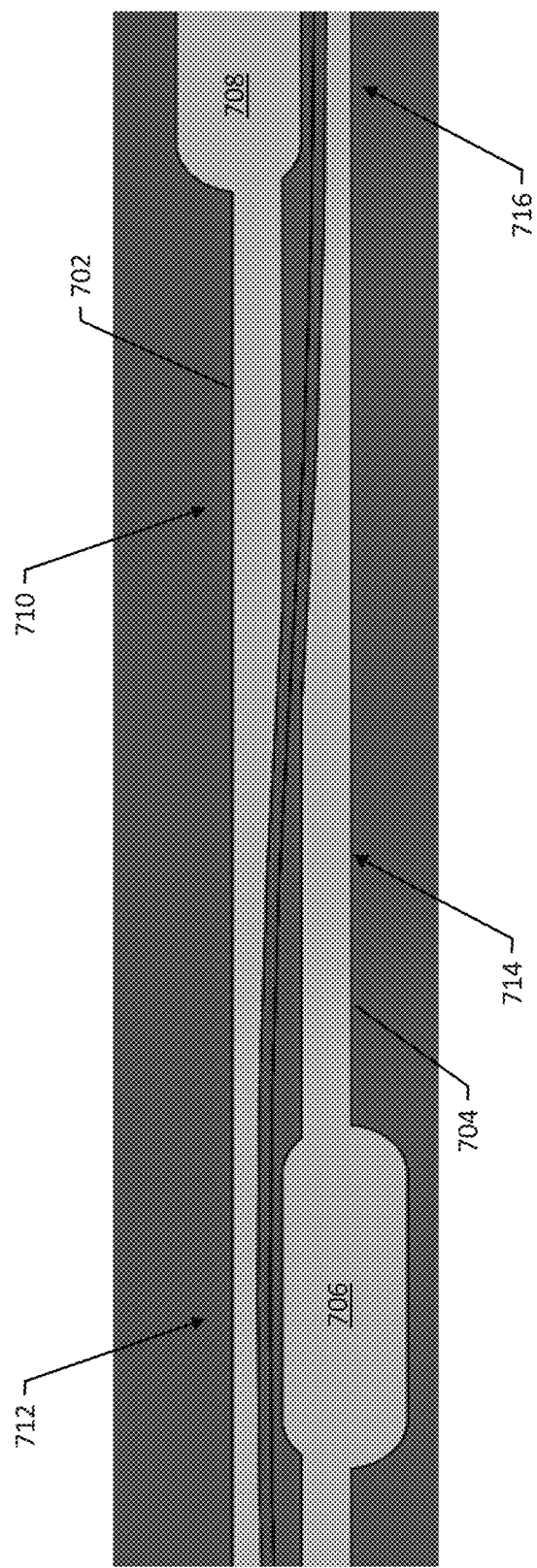

FIGS. 7A-C illustrate a conductive busbar that can be used in shingled solar cell devices. FIG. 7A shows a front view of a portion of the wafer 200 of FIGS. 2A-B. An interior row 230 of contact pads follows a scribe line between two regions 204 and 206 of the wafer 200. Conductive busbars are disposed on the front side of the wafer 200.

FIG. 7B shows a back view of a portion of the wafer 200. An interior row 236 of contact pads follows a scribe line between two regions 202 and 204 of the wafer. The back of the wafer 200 lacks a conductive busbar; however, when the wafer is diced and assembled, the back contact pads will contact corresponding front contact pads so that the back contact pads and front contact pads are electrically connected. In some examples, the back contact pads have a larger area than the front contact pads.

FIG. 7C shows a closer view of the front of the wafer 200 to illustrate the conductive busbars. A top busbar 702 electrically connects the contact pads above the scribe line, and a bottom busbar 704 busbar electrically connects the contact pads below the scribe line. The conductive busbars can be formed of, e.g., silver that is disposed on the wafer.

The conductive busbars have a width that varies along the scribe line. For example, the top busbar 702 has a width that tapers from a full width in a region 710 near a top contact pad 708 to a narrow width in a region 712 between contact pads above the scribe line. The bottom busbar 704 has a width that tapers from a full width in a region 714 near a bottom contact pad 706 to a narrow width in a region 716 between contact pads above the scribe line.

In some examples, the width of each conductive busbar 702 and 704 varies to maintain a constant spacing between the conductive busbar and the scribe line. The width of the conductive busbars 702 and 704 can be formed to maintain at least a specified minimum thickness for current carrying capacity. As illustrated, the conductive busbars 702 and 704 have one edge that is flat and another edge that follows the scribe line to vary the width of the conductive busbars 702 and 704.

Figure 8A:
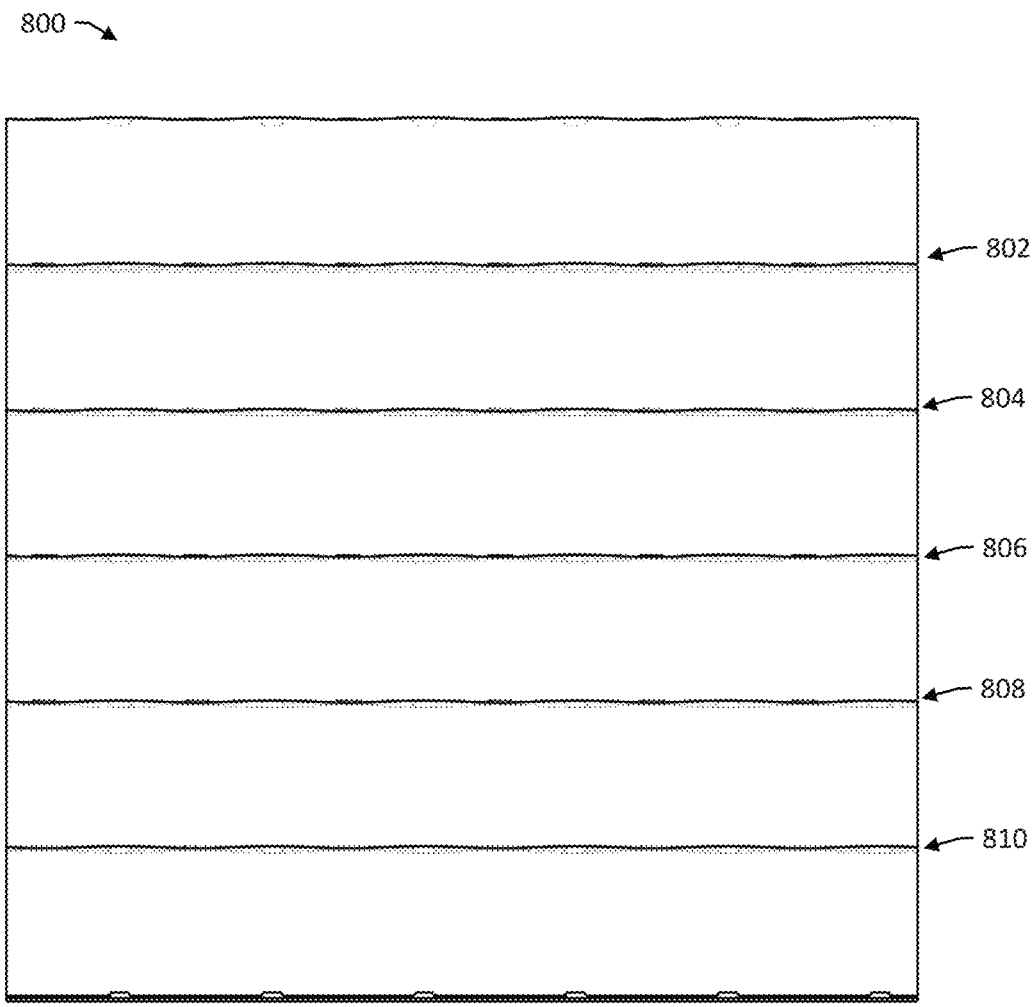
FIGS. 8A-B illustrate shingled solar device 800 having conductive busbars that vary in width.
Figure 8B:
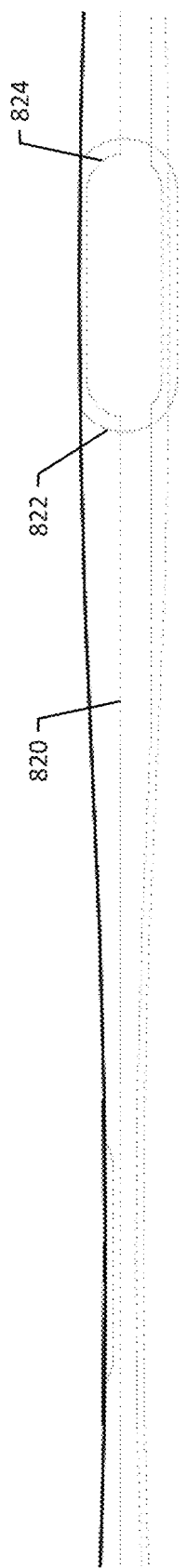

FIGS. 8A-B illustrate shingled solar device 800 having conductive busbars that vary in width. The solar device 800 can be made using the wafer 200 of FIG. 2 and the conductive busbars described with reference to FIGS. 7A-C. The solar device 800 can be assembled as described with reference to FIGS. 4A-G and FIG. 5.

FIG. 8A is a back view of the solar device 800. For purposes of illustration, FIG. 8A shows edges of the solar cells that face the viewer as dark lines, and FIG. 8A shows edges of solar cells that are hidden behind other solar cells in overlapping regions as light lines, as if the solar cells were transparent in those regions (i.e., FIG. 8A is an "x-ray" view). In this view, the viewer can see contact pads as circular shapes in the regions where adjacent solar cells overlap.

The solar device 800 includes rows of contact pads 802, 804, 806, 808, and 810. The contact pads within each row include back contact pads electrically contacted to front contact pads. The front contact pads of each row are electrically connected to other contact pads in the row by conductive busbars. FIG. 8B shows a closer view of an example conductive busbar 820, back contact pad 822, and front contact pad 824.

As assembled in a shingle manner, the conductive busbars are not visible from the front of the solar device 800. Each conductive busbar is fully underneath an overlapping region of adjacent solar cells. The contact pads are also fully underneath the overlapping region of adjacent solar cells. The conductive busbars are narrowest in width where the overlaps between adjacent solar cells is the smallest.

Solar device 800 would generate less power if the conductive busbars were exposed. Varying the width of the conductive busbars so that the conductive busbars are fully underneath overlapping regions of adjacent solar cells can improve the power output of the solar device 800. Moreover, varying the width of the conductive busbars can allow for the adjacent solar cells to be placed with smaller areas of strip overlap, which can also improve the power output of the solar device 800.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar device comprising:
 a plurality of solar cells each including a substantially planar front surface and a substantially planar rear surface having two opposing long edges extending in a length direction between respective ends of two opposing short edges that extend in a width direction, the plurality of solar cells being arranged in a shingled manner such that adjacent long edges of an adjacent pair of the solar cells overlap, wherein
 a first long edge of a first solar cell of the plurality of solar cells has a non-linear shape including protruding portions and includes contact pads arranged in peaks of the protruding portions on the rear surface of the first solar cell,
 a second long edge of a second solar cell of the plurality of solar cells has a non-linear shape including protruding portions and contact pads arranged in peaks of the protruding portions on the front surface of the second solar cell,
 wherein the first long edge and the second long edge are adjacent and overlap to form an overlapping region such that the contact pads on the rear surface of the first long edge of the first solar cell cover and electrically connect to the contact pads on the front surface of the second long edge of the second solar cell and such that the overlapping region in the width direction is larger at the contact pads than at point between the contact pads.

2. The solar device of claim 1, wherein the non-linear shape of the first long edge or the non-linear shape of the second long edge is a sinusoidal pattern.

3. The solar device of claim 1, wherein the solar device comprises a top solar cell, a bottom solar cell, and a plurality of interior solar cells, and wherein each interior solar cell includes a top non-linear edge following a repeating pattern and a bottom undulated edge following the repeating pattern offset from the top non-linear edge to mirror the first repeating pattern.

4. The solar device of claim 1, comprising:
 a sacrificial solar cell overlapping the front surface of an end one of the adjacent solar cells and conductively bonded to the front surface of the end one of the adjacent solar cells to electrically and mechanically connect the rear surface of the sacrificial solar cell in series with the adjacent solar cells;
 a first conductive lead conductively bonded to the rear surface of a solar cell located at an opposite end of the solar device from the sacrificial solar cell, the first conductive lead configured to provide, during operation of the solar device, a first electrical output from the solar device having a first polarity; and
 a second conductive lead conductively bonded to the rear surface of the sacrificial solar cell and configured to provide, during operation of the solar device, a second electrical output from the solar device having a second polarity opposite from the first polarity;
 wherein the sacrificial cell is configured, by virtue of the second conductive lead being conductively bonded to the rear surface of the sacrificial solar cell, to contribute no power to a module-level electrical output of the solar device during operation of the solar device.

5. The solar device of claim 1, comprising a plurality of conductive busbars, wherein each conductive busbar extends along a respective adjacent long edge and electrically connects a row of contact pads arranged along the respective adjacent long edge, and wherein each conductive busbar has a width that varies along a respective adjacent long edge such that the conductive busbar is fully underneath an overlapping region of an adjacent one of the solar cells.

6. A solar cell comprising:
 a top non-linear edge extending in a length direction and following a first pattern including protruding portions;
 a bottom non-linear edge extending in the length direction and following a second pattern that mirrors the first pattern such that the second pattern includes protruding portions;
 two opposing short edges that extend in a width direction between respective ends of the top and bottom non-linear edges;
 a back side and a front side configured, by a semiconductor diode structure, to generate an electric current in response to light shining on the front side; and
 contact pads positioned only in peaks of the protruding portions of the top non-linear edge on the front side of the solar cell and in the bottom non-linear edge on the back side of the solar cell such that the solar cell does not include contact pads along the two opposing short edges.

7. A method of assembly a solar cell device, comprising:
 dividing a photovoltaic wafer into a plurality of solar cells each having a substantially planar front surface and a substantially planar rear surface having two opposing long edges extending in a length direction between respective ends of two opposing short edges that extend in a width direction, a first long edge of a first solar cell of the plurality of solar cells having a non-linear shape including protruding portions, and a second long edge of a second solar cell of the plurality of solar cells having a non-linear shape including protruding portions;
 disposing contact pads along the first long edge in peaks of the protruding portions on the rear surface of the first solar cell;
 disposing contact pads along the second long edge in peaks of the protruding portions on the front surface of the second solar cell of the plurality of solar cells; and
 assembling the solar cells in a shingled manner so that the first long edge and the second long edge are adjacent and overlap to form an overlapping region such that the contact pads on the rear surface of the first solar cell cover and electrically connect to the contact pads on the front surface of the second long edge of the second solar cell and such that the overlapping region in the width direction is larger at the contact pads than at points between the contact pads.

8. The method of claim 7, wherein dividing the photovoltaic wafer comprises scribing the photovoltaic wafer to create a plurality of non-linear scribe lines and cleaving the photovoltaic wafer along the non-linear scribe lines.

9. The method of claim 8, wherein scribing the photovoltaic wafer comprises creating the non-linear scribe lines so that each non-linear scribe line alternatingly extends between a direction towards a top edge of the solar device and a direction towards a bottom edge of the solar device in a repeating pattern.

10. The method of claim 9, wherein creating the non-linear scribe lines comprises following a sinusoidal pattern with a laser scribe machine.

11. The method of claim 10, wherein following the sinusoidal pattern with the laser scribe machine comprises alternating, between each non-linear scribe line, between a first sinusoidal pattern and a second sinusoidal pattern that mirrors the first sinusoidal pattern.

12. The method of claim 10, wherein disposing the contact pads comprises alternatingly disposing each contact pad between a plurality of peaks and a plurality of troughs of a respective non-linear scribe line following the sinusoidal pattern.

13. The method of claim 7, wherein assembling the solar cells in a shingled manner comprises picking and placing, by a robot, the solar cells and rotating, by the robot, every other solar cell by 180 degrees.

14. The method of claim 7, wherein assembling the solar cells in a shingled manner comprises picking and placing, by a first robot, every other solar cell into the solar device and picking and placing, by a second robot, the remaining solar cells into another solar device.

15. The method of claim 7, comprising adding to the solar device:
   a sacrificial solar cell overlapping the front surface of an end one of the adjacent solar cells and conductively bonded to the front surface of the end one of the adjacent solar cells to electrically and mechanically connect the rear surface of the sacrificial solar cell in series with the adjacent solar cells;
   a first conductive lead conductively bonded to the rear surface of a solar cell located at an opposite end of the solar device from the sacrificial solar cell, the first conductive lead configured to provide, during operation of the solar device, a first electrical output from the solar device having a first polarity; and
   a second conductive lead conductively bonded to the rear surface of the sacrificial solar cell and configured to provide, during operation of the solar device, a second electrical output from the solar device having a second polarity opposite from the first polarity;
   wherein the sacrificial cell is configured, by virtue of the second conductive lead being conductively bonded to the rear surface of the sacrificial solar cell, to contribute no power to a module-level electrical output of the solar device during operation of the solar device.

16. The method of claim 7, comprising disposing a plurality of conductive busbars such that each conductive busbar electrically connects a row of contact pads arranged along the respective adjacent long edge, wherein each conductive busbar has a width that varies along a respective adjacent long edge such that the conductive busbar is fully underneath an overlapping region of an adjacent one of the solar cells.

* * * * *

UNITED STATES PATENT AND TRADEMARK OFFICE
CERTIFICATE OF CORRECTION

| | | |
|---|---|---|
| PATENT NO. | : 10,741,703 B2 | Page 1 of 1 |
| APPLICATION NO. | : 15/395727 | |
| DATED | : August 11, 2020 | |
| INVENTOR(S) | : Nathaniel Alexis Caswell et al. | |

It is certified that error appears in the above-identified patent and that said Letters Patent is hereby corrected as shown below:

In the Specification

Below Title insert:
-- STATEMENT REGARDING FEDERALLY SPONSORED RESEARCH OR DEVELOPMENT
This invention was made with government support under DE-EE0007190 awarded by The U.S. Department of Energy. The government has certain rights in the invention.--, in Column 1, Line 10 as a new paragraph.

Signed and Sealed this
Tenth Day of November, 2020

Andrei Iancu
*Director of the United States Patent and Trademark Office*